United States Patent
Kim

(10) Patent No.: US 12,302,728 B2
(45) Date of Patent: May 13, 2025

(54) ELECTRONIC DEVICE WITH DISPLAY PORTION

(71) Applicant: Samsung Display Co., Ltd., Yongin-si (KR)

(72) Inventor: Hwi Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 72 days.

(21) Appl. No.: 17/079,491

(22) Filed: Oct. 25, 2020

(65) Prior Publication Data

US 2021/0175297 A1 Jun. 10, 2021

(30) Foreign Application Priority Data

Dec. 4, 2019 (KR) .................. 10-2019-0160038

(51) Int. Cl.
*H10K 59/35* (2023.01)
*H10K 59/40* (2023.01)
*H10K 59/65* (2023.01)

(52) U.S. Cl.
CPC ........... *H10K 59/353* (2023.02); *H10K 59/40* (2023.02); *H10K 59/65* (2023.02)

(58) Field of Classification Search
CPC .......................... H10K 59/352; H10K 59/353
See application file for complete search history.

(56) References Cited

U.S. PATENT DOCUMENTS

| | | | |
|---|---|---|---|
| 8,816,331 B2 | 8/2014 | Choi et al. | |
| 9,978,306 B2 | 5/2018 | Lee et al. | |
| 2017/0069664 A1* | 3/2017 | Nakamura | H01L 51/0097 |
| 2017/0278906 A1 | 9/2017 | Song et al. | |
| 2017/0317145 A1 | 11/2017 | Hong et al. | |
| 2018/0129328 A1 | 5/2018 | Park et al. | |
| 2019/0130822 A1 | 5/2019 | Jung et al. | |
| 2019/0181345 A1* | 6/2019 | Hwang | H10K 50/813 |
| 2019/0310724 A1* | 10/2019 | Yeke Yazdandoost | G06V 40/1318 |
| 2020/0312832 A1* | 10/2020 | Chi | H01L 27/3218 |
| 2021/0028249 A1* | 1/2021 | Ding | H01L 27/3218 |
| 2021/0065625 A1* | 3/2021 | Wang | G09G 3/3233 |
| 2021/0159286 A1* | 5/2021 | Ma | H10K 59/131 |
| 2021/0265431 A1* | 8/2021 | Yun | H10K 59/121 |

(Continued)

FOREIGN PATENT DOCUMENTS

| | | |
|---|---|---|
| JP | 2010-230797 | 8/2011 |
| KR | 10-2012-0124224 | 11/2012 |
| KR | 10-2016-0113484 | 9/2016 |

(Continued)

*Primary Examiner* — Eric K Ashbahian
(74) *Attorney, Agent, or Firm* — CANTOR COLBURN LLP

(57) ABSTRACT

An electronic device may include a display panel displaying an image. The display panel may include: a substrate including a first display region and a second display region, which are adjacent to each other, and a non-display region surrounding at least one side of each of the first and second display regions; a plurality of first pixels provided in the first display region; and a plurality of second pixels provided in the second display region. The second display region may have a light transmittance higher than that of the first display region, and each of the first pixels may have a size different from that of each of the second pixels.

23 Claims, 25 Drawing Sheets

(56) References Cited

U.S. PATENT DOCUMENTS

2021/0327958 A1* 10/2021 Li .................. H01L 27/156

FOREIGN PATENT DOCUMENTS

| KR | 1020170113066 A | 10/2017 |
|----|-----------------|---------|
| KR | 1020170113867 A | 10/2017 |
| KR | 10-2018-0050473 | 5/2018 |
| KR | 10-2037727 | 10/2019 |

* cited by examiner

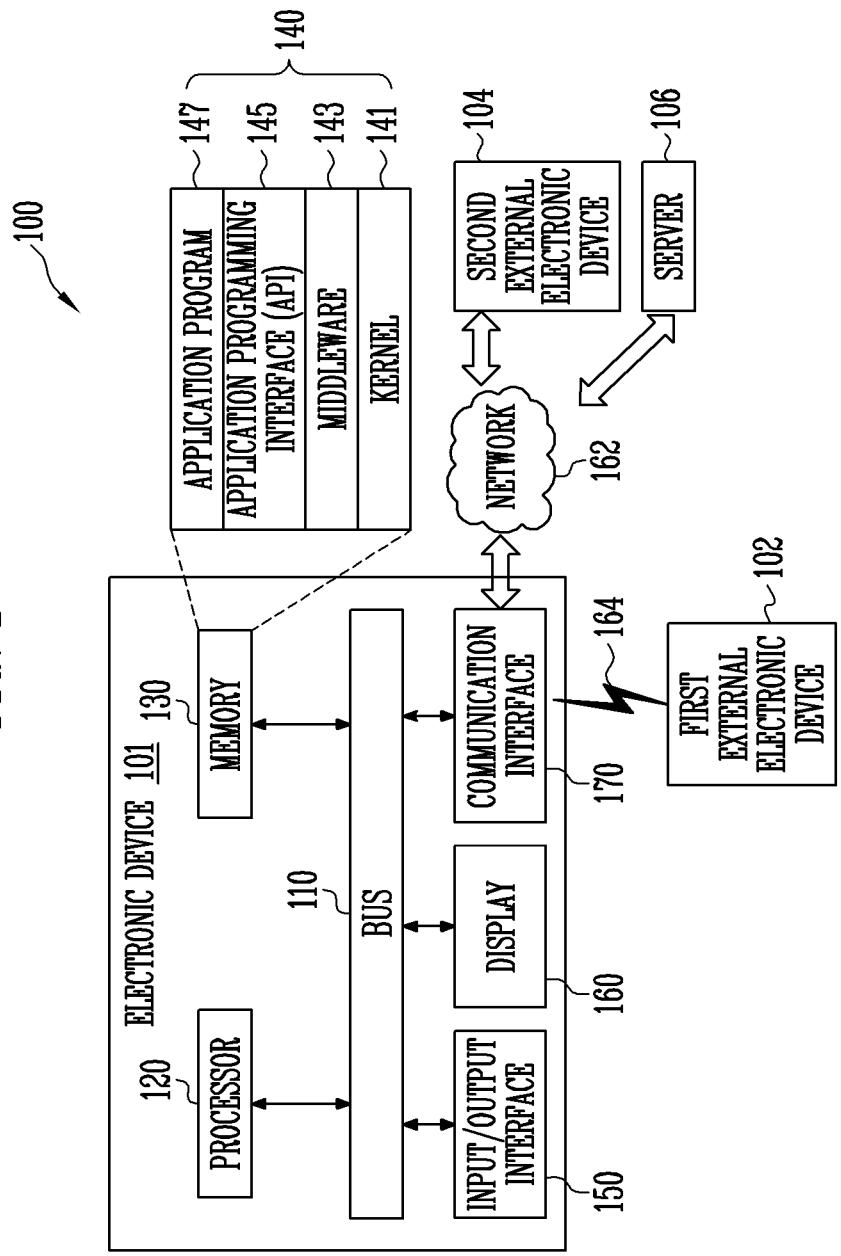

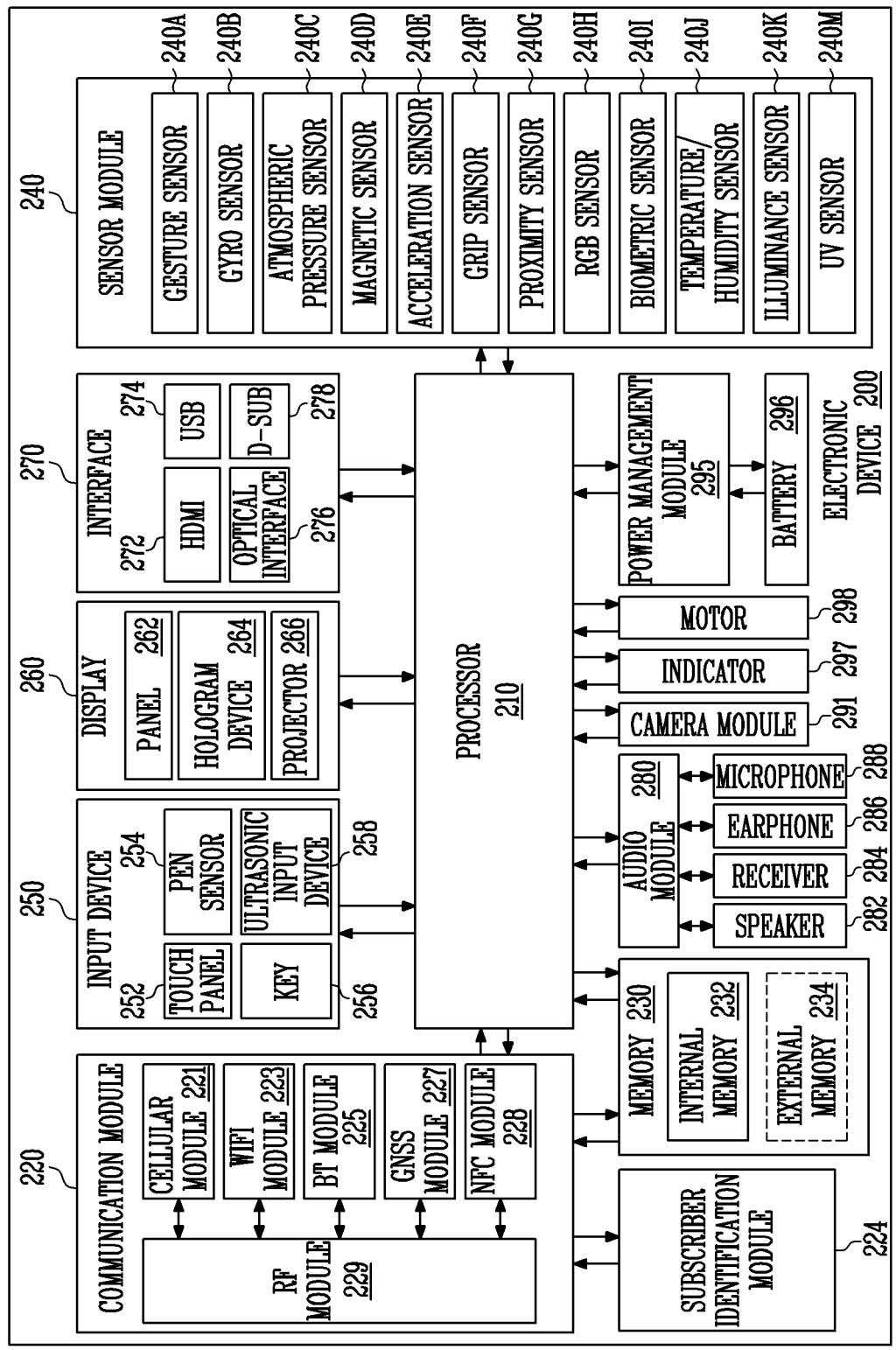

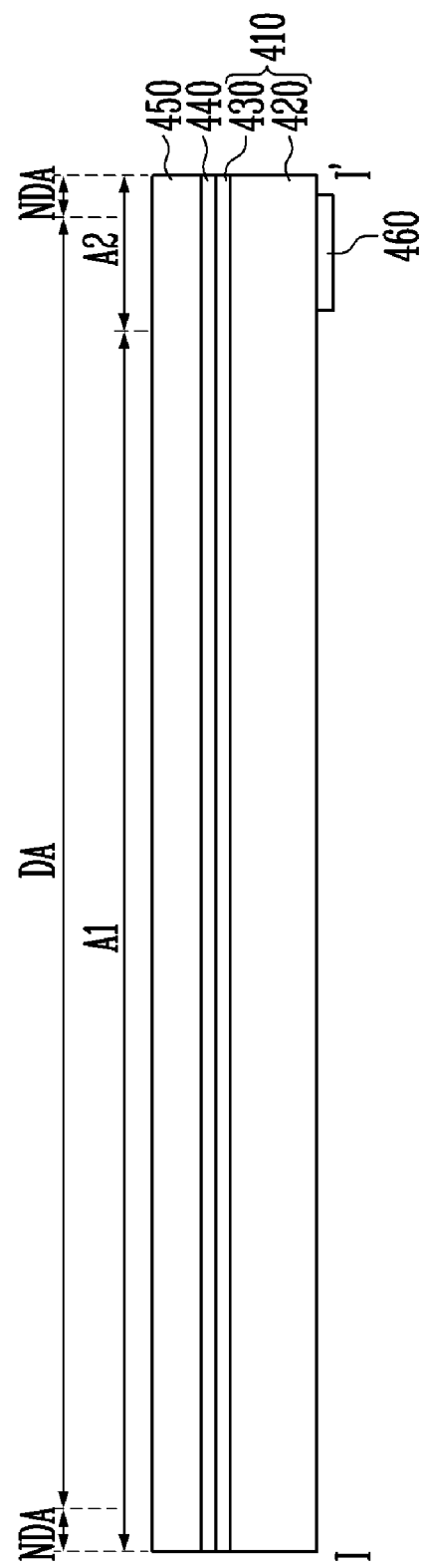

ELECTRONIC DEVICE WITH DISPLAY PORTION

CROSS REFERENCE TO RELATED APPLICATION

This application claims priority from and the benefit of Korean Patent Application No. 10-2019-0160038 filed on Dec. 4, 2019, which is hereby incorporated by reference for all purposes as if fully set forth herein.

BACKGROUND

Field

Exemplary embodiments/implementations of the invention relate generally to an electronic device with a display portion.

Discussion of the Background

An electronic device such as a typical smartphone may include at least one display portion. The display portion is a data output device, and input data may be displayed on the display portion. Also, the display portion may include a touch sensor, to be operated as a touch screen. The display portion may be mounted at a front surface of the electronic device, to display various types of information.

Recently, in an electronic device such as a mobile terminal, a display portion has occupied a majority of a front surface of the electronic device, and therefore, a camera, a proximity sensor, a fingerprint recognition sensor, an illuminance sensor, a near-infrared sensor, and the like may overlap with at least one region of the display portion. In a sensor region overlapping with the display portion, the density of pixels may be decreased so as to increase the transmittance of light. A change in density of pixels between the sensor region and a display region may cause a difference in luminance between the sensor region and the display region, and the difference in luminance may be viewed as discontinuity of an image by a user.

The above information disclosed in this Background section is only for understanding of the background of the inventive concepts, and, therefore, it may contain information that does not constitute prior art.

SUMMARY

Exemplary embodiments provide an electronic device with a display portion, which can improve the quality of an image.

Additional features of the inventive concepts will be set forth in the description which follows, and in part will be apparent from the description, or may be learned by practice of the inventive concepts.

In one or more exemplary embodiments of the invention, an electronic device includes: a display panel displaying an image, wherein the display panel includes: a substrate including a first display region and a second display region, which are adjacent to each other, and a non-display region surrounding at least one side of each of the first and second display regions; a plurality of first pixels provided in the first display region; and a plurality of second pixels provided in the second display region.

The second display region may include a first sub-region in which each of the second pixels is disposed and a second sub-region in which the second pixel is not disposed. The second display region may have a light transmittance higher than that of the first display region.

Each of the first pixels may have a size different from that of each of the second pixels.

The first pixels in the first display region may have a density higher than that of the second pixels in the second display region. The second display region may have a size smaller than that of the first display region, and be connected to the first display region.

The second pixels may be arranged in an oblique direction on a plane.

The electronic device may include at least one sensor disposed on a rear surface of the display panel.

The sensor may include at least one of a camera, a proximity sensor, an illuminance sensor, a gesture sensor, a motion sensor, a fingerprint recognition sensor, and a biometric sensor, or combinations thereof.

The second sub-region may include a transmissive region through which light is transmitted.

The first sub-region and the second sub-region may be alternately disposed. The first sub-region may be provided in plurality in the second display region, and the second sub-region may be provided in plurality in the second display region.

The plurality of first sub-regions may be repeatedly arranged along one direction in the second display region to constitute at least one first column, and the plurality of second sub-regions may be repeatedly arranged along the one direction in the second display region to constitute at least one second column. The first column and the second column may be alternately disposed.

The plurality of first sub-regions may be repeatedly arranged along one direction in the second display region to constitute at least one column, and the plurality of second sub-regions may be repeatedly arranged along a direction orthogonal to the one direction to constitute at least one row.

Each of the first pixels may include at least one first sub-pixel provided in the first display region. The first sub-pixel may include: a first electrode disposed on the substrate; a first emitting layer disposed on the first electrode; and a second electrode disposed on the first emitting layer.

Each of the second pixels may include at least one second sub-pixel provided in the first sub-region. The second sub-pixel may include: a third electrode disposed on the substrate, the third electrode being provided in the same layer as the first electrode; a second emitting layer disposed on the third electrode; and a fourth electrode disposed on the second emitting layer.

The first sub-pixel and the second sub-pixel may have different sizes.

The second sub-pixel may have a size greater than that of the first sub-pixel.

The first sub-pixel may include a first emission region in which the first electrode, the first emitting layer, and the second electrode overlap with each other, and the second sub-pixel may include a second emission region in which the third electrode, the second emitting layer, and the fourth electrode overlap with each other. The second emission region may have a size greater than that of the first emission region.

The electronic device may further include an insulating layer disposed between the substrate and the third electrode. The insulating layer may extend to the second sub-region. The fourth electrode may not extend to the second sub-region.

Each of the first and second sub-pixels may emit any one of red light, green light, blue light, and white light.

The second sub-pixel may have a size that gradually changes approaching a boundary portion between the first display region and the second display region.

The second sub-pixel may have a size gradually decreased as approaching the boundary portion between the boundary portion and the second display portion.

The second sub-pixel may have a size gradually increased as approaching the boundary portion between the boundary portion and the second display portion.

The second sub-region may include at least one insulating layer which is disposed on the substrate and includes an opening. The second sub-region may include a filling material filling the opening.

Each of the first and second pixels may include a pixel circuit layer which is disposed on the substrate and includes at least one transistor.

The first display region may include a first unit pixel region in which each of the first pixels is disposed, and the second display region may include a second unit pixel region in which each of the second pixels is disposed. The first unit pixel region and the second unit pixel region may have the same size.

In one or more exemplary embodiments of the invention, an electronic device includes: at least one sensor sensing incident light; a display portion overlapping with the sensor, the display portion displaying an image; a window provided on the display portion to cover the display portion; and a touch sensor provided between the display portion and the window, the touch sensor sensing a touch of a user.

The display portion may include: a substrate including a first display region, a second display region which has an area smaller than that of the first display region, is connected to the first display region, and has a light transmittance higher than that of the first display region, and a non-display region surrounding the periphery of each of the first and second display regions; a plurality of first pixels provided in the first display region; and a plurality of second pixels provided in the second display region, the plurality of second pixels being different from the first pixels, the plurality of second pixels each having a size greater than that of each of the first pixels.

The second display region may include a first sub-region in which each of the second pixels is disposed and a transmissive region in which the second pixel is not disposed, the transmissive region having light transmitted therethrough.

The first sub-region and the second sub-region may be alternately disposed when viewed on a plane.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 1 is a block diagram illustrating an electronic device in a network environment in accordance with various embodiments.

FIG. 2 is a block diagram of an electronic device in accordance with various embodiments.

FIG. 5 is a sectional view taken along line I-I' shown in FIG. 4A.

DETAILED DESCRIPTION

Figure 3A:
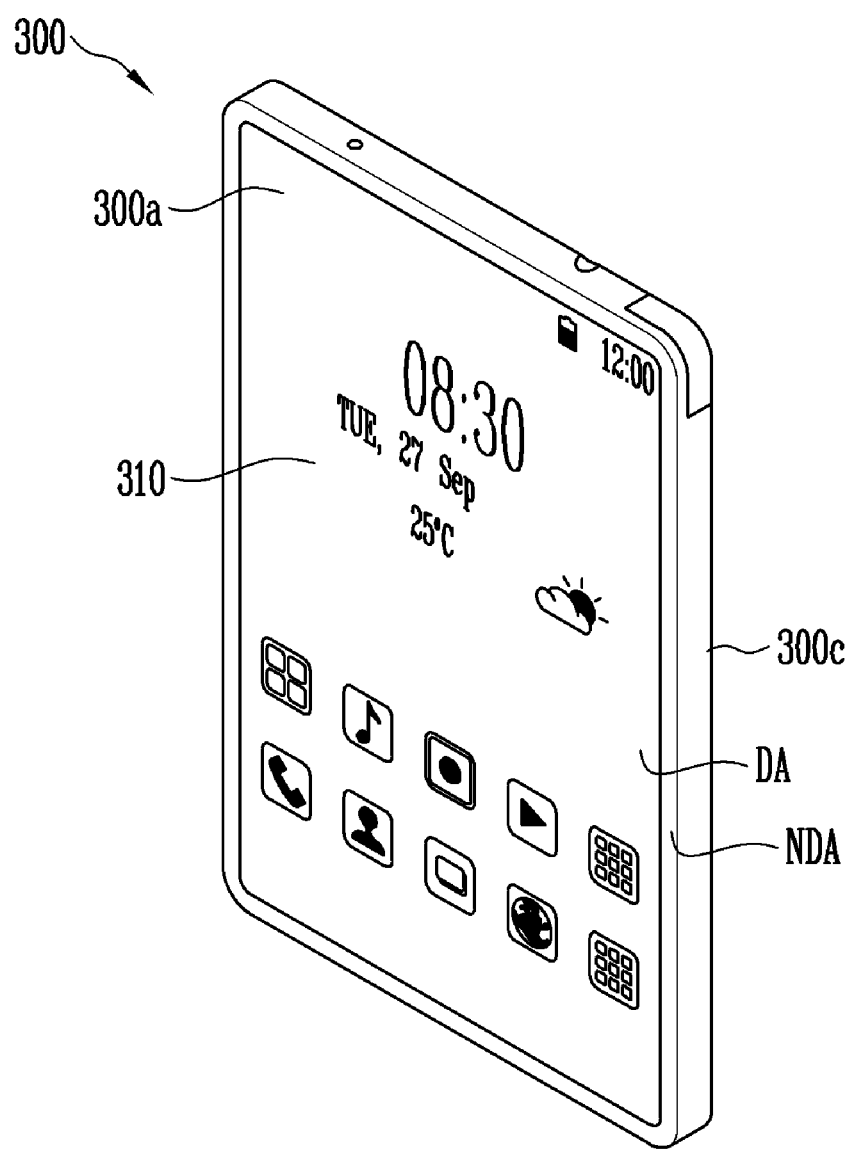
FIG. 3A is a perspective view briefly illustrating a front surface of an electronic device in accordance with various embodiments.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

An electronic device in accordance with embodiments of the present disclosure may include at least one of a smartphone, a tablet personal computer (PC), a mobile phone, a video phone, an electronic book reader, a desktop PC, a laptop PC, a netbook computer, a workstation, a server, a personal digital assistant (PDA), a portable multimedia player (PMP), a motion pictures experts group (MPEG)-1 audio layer-3 (MP3) player, a medical device, a camera, and a wearable device. The wearable device may include at least one of an accessory type (e.g., a watch, ring, wristlet, anklet, necklace, glasses, contact lens, or head-mounted-device (HMD)), a fabric or clothing integral type (e.g., electronic clothes), human-body mount type (e.g., a skin pad or tattoo), and a bio implantation type circuit. In some embodiments, the electronic device may include at least one of a television (TV), a digital video disc (DVD) player, an audio system, a refrigerator, an air conditioner, a cleaner, an oven, a microwave, a washing machine, an air cleaner, a set-top box, a home automation control panel, a security control panel, a media box, a game console, an electronic dictionary, an electronic locking system, a camcorder, or an electronic frame, and a holographic image display device (e.g., a gate block).

In another embodiment, the electronic device may include at least one of various medical devices, (e.g., various portable medical measurement devices, such as a blood glucose sensor, a heart rate sensor, a blood pressure monitor, and a body temperature meter, magnetic resonance angiography (MRA), magnetic resonance imaging (MRI), computed tomography (CT), a photographing machine, and an ultrasonic machine), a navigation device, a global navigation satellite system (GNSS), an event data recorder (EDR), a flight data recorder (FDR), a car infotainment device, electronic equipment for ship (e.g., a navigation device and a gyrocompass), avionics, a security device, a head unit for car, an industrial or home robot, a drone, an automated teller machine (ATM), a point of sales (POS) device, or an Internet of Things (IoT) device, (e.g., an electric light bulb, various sensors, a sprinkler device, a fire alarm, a thermostat, a streetlight, a toaster, an exerciser, a hot water tank, a heater, or a boiler). In some embodiments, the electronic device may include at least part of furniture, a building/structure or a car, an electronic board, an electronic signature receiving device, a projector, and various metering devices (e.g., tap water, electricity, gas, and radio wave metering devices). In various embodiments, the electronic device may be flexible, or be a combination of at least two of the aforementioned devices. The electronic device in accordance with the present disclosure is not limited to the above-described devices. In the present disclosure, the term 'user' may denote a person who uses the electronic device or a device (e.g., an artificial-intelligence electronic device) which uses the electronic device.

FIG. 1 is a block diagram illustrating an electronic device in a network environment in accordance with various embodiments.

Referring to FIG. 1, an electronic device 101 in a network environment 100 in accordance with various embodiments is illustrated.

The electronic device 101 may include a bus 110, a processor 120, a memory 130, an input/output interface 150, a display 160, and a communication interface 170. In some embodiments, the electronic device 101 may omit at least one of the components or additionally have other components.

The bus 110 may include a circuit which connects the components 120, 130, 150, 160, and 170 to each other and transfers communications (e.g., control messages or data) between the components 120, 130, 150, 160, and 170.

The processor 120 may include one or more of a Central Processing Unit (CPU), an Application Processor (AP), and a Communication Processor (CP). The processor 120 may execute, for example, an operation or data processing related to control and/or communication of at least one other component of the electronic device 101.

The memory 130 may include volatile and/or nonvolatile memory. The memory 130 may store, for example, commands or data related to at least one other element of the electronic device 101. In accordance with an embodiment of the present disclosure, the memory 130 may store software and/or a program 140.

The program 140 may include, for example, a kernel 141, middleware 143, an Application Programming Interface (API) 145, and/or an application program (or "application") 147. At least some of the kernel 141, the middleware 143, and the API 145 may be referred to as an operating system (OS).

The kernel 141 may control or manage system resources (e.g., the bus 110, the processor 120, the memory 130, and the like) used for executing an operation or a function implemented by other programs (e.g., the middleware 143, the API 145, and the application program 147). Also, the kernel 141 may provide an interface capable of controlling or managing system resources by accessing individual components of the electronic device 101 from the middleware 143, the API 145, or the application program 147.

The middleware 143 may serve as, for example, an intermediary for enabling the API 145 or the application program 147 to exchange data with the kernel 141 by communicating with the kernel 141. Also, the middleware 143 may process one or more work requests received from the application program 147 according to an order of priority. For example, the middleware 143 may provide at least one of the application programs 147 with an order of priority to use a system resource (e.g., the bus 110, the processor 120, the memory 130, or the like) of the electronic device 101, and process the one or more work requests according to the order of priority.

The API 145 is an interface through which the application 147 controls a function provided by the kernel 141 or the middleware 143, and may include, for example, at least one interface or function (e.g., a command) for controlling file control, window control, image processing, text control, or the like.

For example, the input/output interface 150 may transfer commands or data input from a user or other external devices to other component(s) of the electronic device 101, or output commands or data received from other component(s) of the electronic device 101 to the user or the other external devices.

The display 160 (or display portion) may include, for example, a liquid crystal display (LCD), a light emitting diode (LED) display, an organic LED (OLED) display, a micro-electromechanical systems (MEMS) display, an electronic paper display, a holographic display, or the like. The display 160 (or display portion) may display, for example, various contents (e.g., texts, images, videos, icons, and/or symbols) to the user. The display 160 (or display portion) may include a touchscreen, and receive, for example, a touch, gesture, proximity, drag, swipe, or hovering input using an electronic pen or a body part of the user.

For example, the communication interface 170 may set up communication between the electronic device 101 and an external device (e.g., a first external electronic device 102, a second external electronic device 104, or a server 106). The communication interface 170 may be connected to a network 162 through wireless communication or wired communication to communicate with an external device (e.g., the second external electronic device 104 or the server 106).

The wireless communication may include cellular communication which uses at least one of, for example, long term evolution (LTE), LTE-advanced (LTE-A), code division multiple access (CDMA), wideband CDMA (WCDMA), universal mobile telecommunication system (UMTS), wireless broadband (WiBro), global system for mobile communication (GSM), and the like.

In some embodiments, the wireless communication may include a short range communication 164. For example, the short range communication 164 may include at least one of a Wireless Fidelity (WiFi), Bluetooth, Bluetooth low energy (BLE), Zigbee, near field communication (NFC), Magnetic Secure Transmission, Radio Frequency (RF), and a body area network (BAN). In another embodiment, the wireless communication may include a GNSS. The GNSS may be, for example, Global Positioning System (GPS), Global Navigation Satellite System (Glonass), Beidou Navigation Satellite System (hereinafter, referred to as "Beidou"), or Galileo, the European global satellite-based navigation system. Hereinafter, in the present disclosure, "GPS" can be used interchangeably with "GNSS."

The wired communication may include, for example, at least one of a Ethernet, universal serial bus (USB), a high definition multimedia interface (HDMI), a recommended standard 232 (RS-232), a power line communication, and a plain old telephone service (POTS). The network 162 may include at least one of a telecommunications network, for example, a computer network (e.g., LAN or WAN), the Internet, and a telephone network.

Each of the first and second external electronic devices 102 and 104 may be the same kind of the electronic device 101 or a different kind of device from the electronic device 101. In accordance with various embodiments, all or some of the operations performed in the electronic device 101 may be performed in one or more other electronic devices (e.g., the first and second external electronic devices 102 and 104, or the server 106). In some embodiments, when the electronic device 101 is to perform a function or service automatically or on demand, the electronic device 101 may request other devices (e.g., the first and second external electronic device 102 and 104, or the server 106) of at least some functions associated with the function or service, instead of or in addition to automatically performing the function or service. Another electronic device (e.g., the first and second external electronic device 102 and 104, or the server 106) may perform a request or additional function, and transfer a result obtained by performing the request or additional function to the electronic device 101. The electronic device 101 may provide the request function or service by additionally processing the received result or as it is. To this end, for example, cloud computing, distributed computing, or client-server computing technology may be utilized.

FIG. 2 is a block diagram of an electronic device in accordance with various embodiments.

Referring to FIG. 2, the electronic device 200 may include the whole or a portion of the electronic device 101 shown in FIG. 1. The electronic device 200 may include one or more processors (e.g., AP) 210, a communication module 220, a subscriber identification module 224, a memory 230, a sensor module 240, an input device 250, a display 260 (or display portion), an interface 270, an audio module 280, a camera module 291, a power management module 295, a battery 296, an indicator 297, and a motor 298.

The processor 210 may control a plurality of hardware and software components connected to the processor 210 by running, for example, an operating system (OS) or application programs, and process and compute various data. The processor 210 may be implemented in, for example, a system on chip (SoC). In some embodiments, the processor 210 may further include a graphic processing unit (GPU) and/or an image signal processor (ISP). The processor 210 may include at least some (e.g., a cellular module 221) of the components shown in FIG. 2. The processor 210 may load a command or data received from at least one of other components (e.g., a nonvolatile memory) on a volatile memory, process the command or data, and store resultant data in the nonvolatile memory.

The communication module 220 may have a configuration identical or similar to that of the communication interface 170. The communication module 220 may include, for example, the cellular module 221, a WiFi module 223, a Bluetooth (BT) module 225, a GNSS module 227, an NFC module 228, and an RF module 229.

The cellular module 221 may provide voice call, video call, text, or Internet services through, for example, a communication network. In some embodiments, the cellular module 221 may perform identification or authentication on the electronic device 200 in the communication network by using the subscriber identification module 224 (e.g., a SIM card). In some embodiments, the cellular module 221 may perform at least some of functions which can be provided by the processor 210. In another embodiment, the cellular module 221 may include a communication processor (CP). In still another embodiment, at least some (e.g., two or more) of the cellular module 221, the WiFi module 223, the BT module 225, the GNSS module 227, and the NFC module 228 may be included in a single integrated circuit (IC) or an IC package.

The RF module 229 may communicate, for example communication signals (e.g., RF signals). The RF module 229 may include, for example, a transceiver, a power amp module (PAM), a frequency filter, a low noise amplifier (LNA), an antenna, or the like. In another embodiment, at least one of the cellular module 221, the WiFi module 223, the BT module 225, the GNSS module 227, and the NFC module 228 may communicate RF signals through a separate RF module. The subscriber identification module 224 may include, for example, a card including a subscriber identification module, or an embedded SIM, and contain unique identification information (e.g., an IC card identifier (ICCID)) or subscriber information (e.g., an international mobile subscriber identity (IMSI)).

The memory 230 (e.g., the memory 130) may include, for example, an internal memory 232 or an external memory 234. The internal memory 232 may include at least one of, for example, a volatile memory (e.g., a dynamic random access memory (DRAM), a static RAM (SRAM), a synchronous dynamic RAM (SDRAM), etc.) or a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM), a flash memory (e.g., a NAND flash, or a NOR flash), a hard drive, or solid state drive (SSD). The external memory 234 may include a flash drive, e.g., a compact flash (CF) memory, a secure digital (SD) memory, a micro-SD memory, a min-SD memory, an extreme digital (xD) memory, a multi-media card (MMC), or a Memory Stick™. The external memory 234 may be functionally or physically connected with the electronic device 200 through various interfaces.

For example, the sensor module 240 may measure a physical quantity or detect an operational state of the electronic device 200, and convert the measured or detected information into an electrical signal. The sensor module 240 may include at least one of, for example, a gesture sensor 240A, a gyro sensor 240B, an air (atmospheric) pressure sensor 240C, a magnetic sensor 240D, an acceleration sensor 240E, a grip sensor 240F, a proximity sensor 240G, a color sensor 240H (e.g., a red-green-blue (RGB) sensor), a biometric sensor 240I, a temperature/humidity sensor 240J, an illuminance sensor 240K, or an ultra violet (UV) sensor 240M. Additionally or alternatively, the sensor module 240 may include, for example, an e-nose sensor, an electromyography (EMG) sensor, an electroencephalogram (EEG) sensor, an electrocardiogram (ECG) sensor, an infrared (IR) sensor, an iris sensor, or a finger print sensor. The sensor module 240 may further include a control circuit for controlling at least one of the sensors included therein. In some embodiments, the electronic device 200 may further include a processor configured to control the sensor module 240 as a portion of the processor 210 or separately from the processor 210, and control the sensor module 240 while the processor 210 is in a sleep mode.

The input device 250 may include, for example, a touch panel 252, a pen sensor 254, a key 256, or an ultrasonic input device 258.

The touch panel 252 may use at least one of capacitive, resistive, infrared, or ultrasonic methods. Also, the touch panel 252 may further include a control circuit. The touch panel 252 may further include a tactile layer, to provide a user with a tactile reaction. The pen sensor 254 may include, for example, a portion of the touch panel 252 or a separate sheet for recognition. The key 256 may include, for example, a physical button, optical key or key pad. The ultrasonic input device 258 may sense an ultrasonic wave generated from an input tool through a microphone (e.g., a microphone 288) to identify data corresponding to the sensed ultrasonic wave.

The display 260 (e.g., the display 160 shown in FIG. 1 or display portion) may include a panel 262, a hologram device 264, a projector 266, and/or a control circuit for controlling the same. The panel 262 may be implemented to be, for example, flexible, transparent, or wearable. The panel 262 along with the touch panel 252 may be configured in one or more modules. The hologram device 264 may make three-dimensional (3D) images (holograms) in the air by using light interference. In an example, the hologram device 264 may include a gate box as a virtual home robot which communicates with a user by displaying a virtual (holographic) character. The projector 266 may display an image by projecting light onto a screen. The screen may be, for example, located inside or outside of the electronic device 200. The interface 270 may include, for example, an HDMI 272, a USB 274, an optical interface 276, or a D-subminiature (D-sub) 278. The interface 270 may be included in, for example, the communication interface 170 shown in FIG. 1. Additionally or alternatively, the interface 270 may include, for example, a mobile high-definition link (MI-IL) interface, an SD card/MMC interface, or an IR data association (IrDA) standard interface.

The audio module 280 may convert, for example, a sound signal into an electrical signal and vice versa. At least a portion of the audio module 280 may be included in, for example, the input/output interface 150 as shown in FIG. 1. The audio module 280 may process sound information input or output through, for example, a speaker 282, a receiver 284, an earphone 286, a microphone 288, or the like. For example, the camera module 291 may be a device for capturing still images and moving images. In an embodiment, the camera module 291 may include one or more image sensors (e.g., a front sensor or rear sensor), a lens, an image signal processor (ISP), or a flash (e.g., an LED, a xenon lamp, etc.).

The power management module 295 may manage power of the electronic device 200, for example. In an embodiment, the power management module 295 may include a power management IC (PMIC), a charger IC, or a battery or fuel gauge. The PMIC may have a wired and/or wireless recharging scheme. The wireless charging scheme may include, for example, a magnetic resonance scheme, a magnetic induction scheme, or an electromagnetic wave based scheme, and an additional circuit, such as a coil loop, a resonance circuit, a rectifier, or the like may be added for wireless charging. The battery gauge may measure an amount of remaining power of the battery 296, a voltage, a current, or a temperature while the battery 296 is being charged. The battery 296 may include, for example, a rechargeable battery or a solar battery.

The indicator 297 may indicate a particular state of the electronic device 200 or a portion (e.g., the processor 210) of the electronic device 200, including, for example, a booting state, a message state, or recharging state. The motor 298 may convert an electric signal to a mechanical vibration and generate a vibrational or haptic effect.

The electronic device 200 may include a mobile television (TV) supporting device (e.g., a GPU) which may process media data according to, for example, digital multimedia broadcasting (DMB), digital video broadcasting (DVB), or mediaFlo™ standards.

Each of the above-described components of the electronic device 200 may include one or more components, and a name of a corresponding component may vary depending on a type of the electronic device to which the corresponding component is applied. In various embodiments, the electronic device 200 may exclude some components or include additional components, or some of the components may be combined into a single entity which may perform the same function as the components before being combined.

In some embodiments, the processor 210 may generate an image through an application operation. When the application operation is associated with a sensor (e.g., an image sensor), the processor 210 may remove an image corresponding to a first region in which the sensor is located, in the generated image. Subsequently, the processor 210 may display, on the display 260, the entire image from which the image of the first region has been removed.

In another embodiment, when the application operation is not associated with a sensor, the processor 210 may correct the image of the first region in which the sensor is located, in the generated image. For example, the processor 210 may compensate for the image of the first region with a higher brightness or saturation as compared with the original image (e.g., the image of a second region) such that the image of the first region is not visually awkward. For example, the second region may be a peripheral region of the first region in an opaque display region.

In still another embodiment, the processor 210 may compensate for the hue of the image of the first region by adjusting optical characteristics of at least one organic light emitting device in the second region. In still another embodiment, the processor 210 may compensate for the hue of the image of the first region by adjusting optical characteristics of at least one organic light emitting device of the first region. In still another embodiment, the processor 210 may compensate for the hue of the image of the first region by adjusting optical characteristics of at least one organic light emitting device of the first region and optical characteristics of at least one organic light emitting device of the second region.

Subsequently, the processor 210 may display, on the display 260, the entire image on which the image of the first region has been corrected.

Figure 3B:
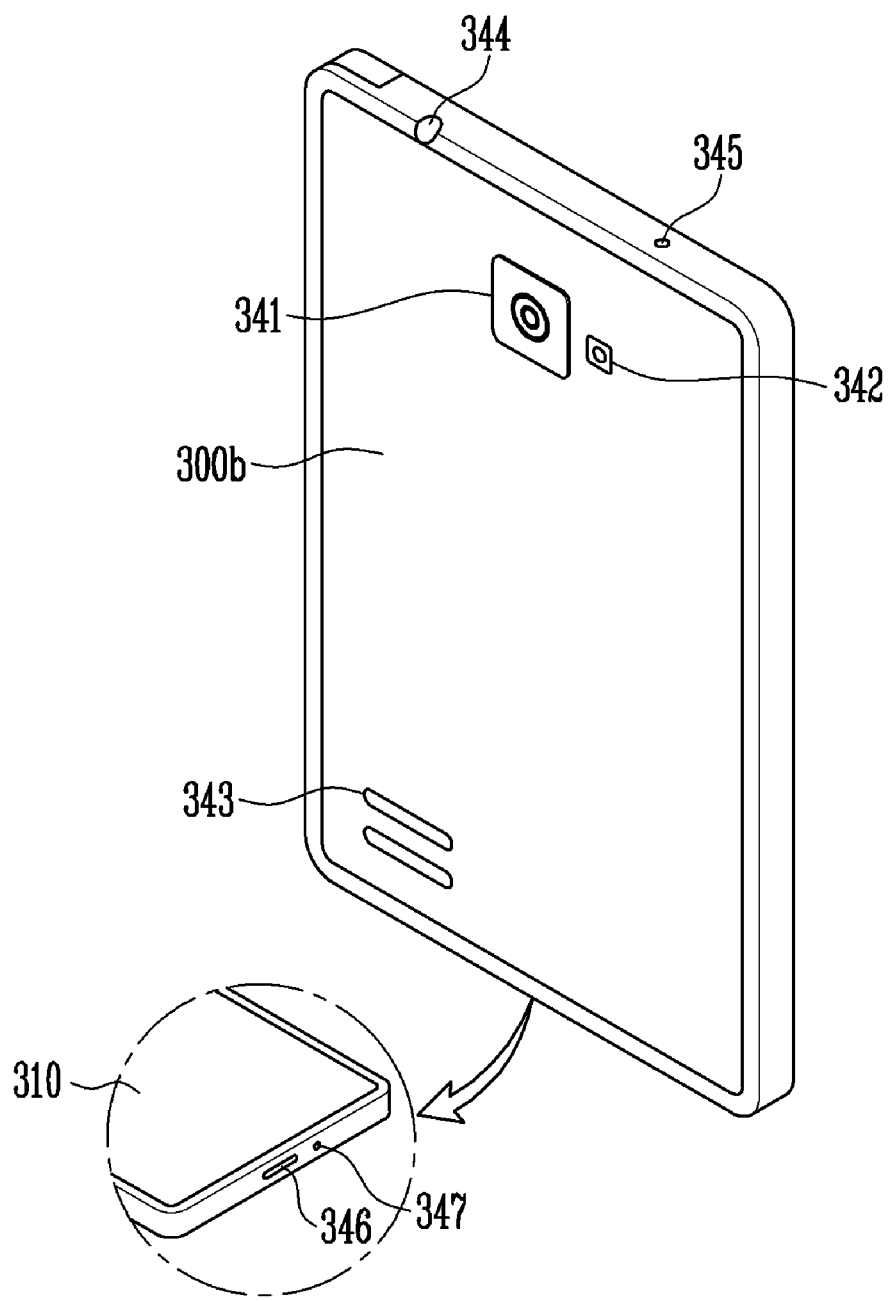
FIG. 3B is a perspective view briefly illustrating a rear surface of the electronic device shown in FIG. 3A.

FIG. 3A is a perspective view briefly illustrating a front surface of an electronic device in accordance with various embodiments. FIG. 3B is a perspective view briefly illustrating a rear surface of the electronic device shown in FIG. 3A.

In FIGS. 3A and 3B, the electronic device 300 may be the same electronic device as the electronic devices 101 and 200 shown in FIGS. 1 and 2. In an example, the electronic device 300 may be a portable device including a display panel. In addition, for convenience of description, an example in which a main home screen is displayed on a display portion 310 of the electronic device 300 is illustrated in FIG. 3A.

Referring to FIGS. 1 to 3B, the display portion 310 may be disposed at a front surface 300a of the electronic device 300 in accordance with the various embodiments. The front surface 300a of the electronic device 300 may include a display region DA in which the display portion 310 is disposed to display various data and a non-display region NDA provided at at least one side of the display region DA.

A rear camera 341, a flash 342, a speaker 343, and the like may be located at a rear surface 300b of the electronic device 300 in accordance with the various embodiments. In addition, for example, a power/reset button, a volume button, a terrestrial DMB antenna for broadcasting reception, one or more microphones 345 and 347, and the like may be located at a side surface 300c of the electronic device 300 in accordance with the various embodiments. In addition, a connector 346 may be formed at a lower end side surface of the electronic device 300 in accordance with the various embodiments. The connector 346 is formed with a plurality of electrodes, and be connected to an external device by wire. An earphone connection jack 344 may be disposed at an upper end side surface of the electronic device 300.

In the above-described electronic device 300, for example, a component such as a sensor is disposed at a lower portion of the inside of the display portion 310, so that the appearance of the front surface 300a of the electronic device 300 becomes beautiful, and the display region DA can be more widely secured. The component may be an optical component associated with light. In an example, the component may be an optical component into which external light is incident or an optical component when emits light. The optical component may include, for example, a fingerprint scanner, an image capturing device, a strobe, a photo sensor, a proximity sensor, an indicator, a solar panel, or the like.

The display portion 310 may be disposed as a large screen so as to occupy the entire of the front surface 300a of the electronic device 300. When the display portion 310 is entirely disposed at the front surface 300a of the electronic device 300, the electronic device 300 may be substantially referred to as a "full front display." In the "full front display," the front surface 300a of the electronic device 300 may be entirely the display region DA.

The above-described display portion 310 may be an organic light emitting display panel. The electronic device 300 including the above-described display portion 310 may be an organic light emitting display device. In some embodiments, the display portion 310 may be configured as a touch screen including touch electrodes.

As shown in FIG. 3A, a main home screen may be displayed on the display portion 310. The main home screen may be a first screen displayed on the display portion 310, when the power of the electronic device 300 is turned on. States of the electronic device 300, such as a battery charging state, the intensity of a received signal, and a current time, may be displayed at an upper end of the display portion 310. The display portion 310 may display various contents (e.g., texts, images, videos, icons, and/or symbols) to a user.

Figure 4A:
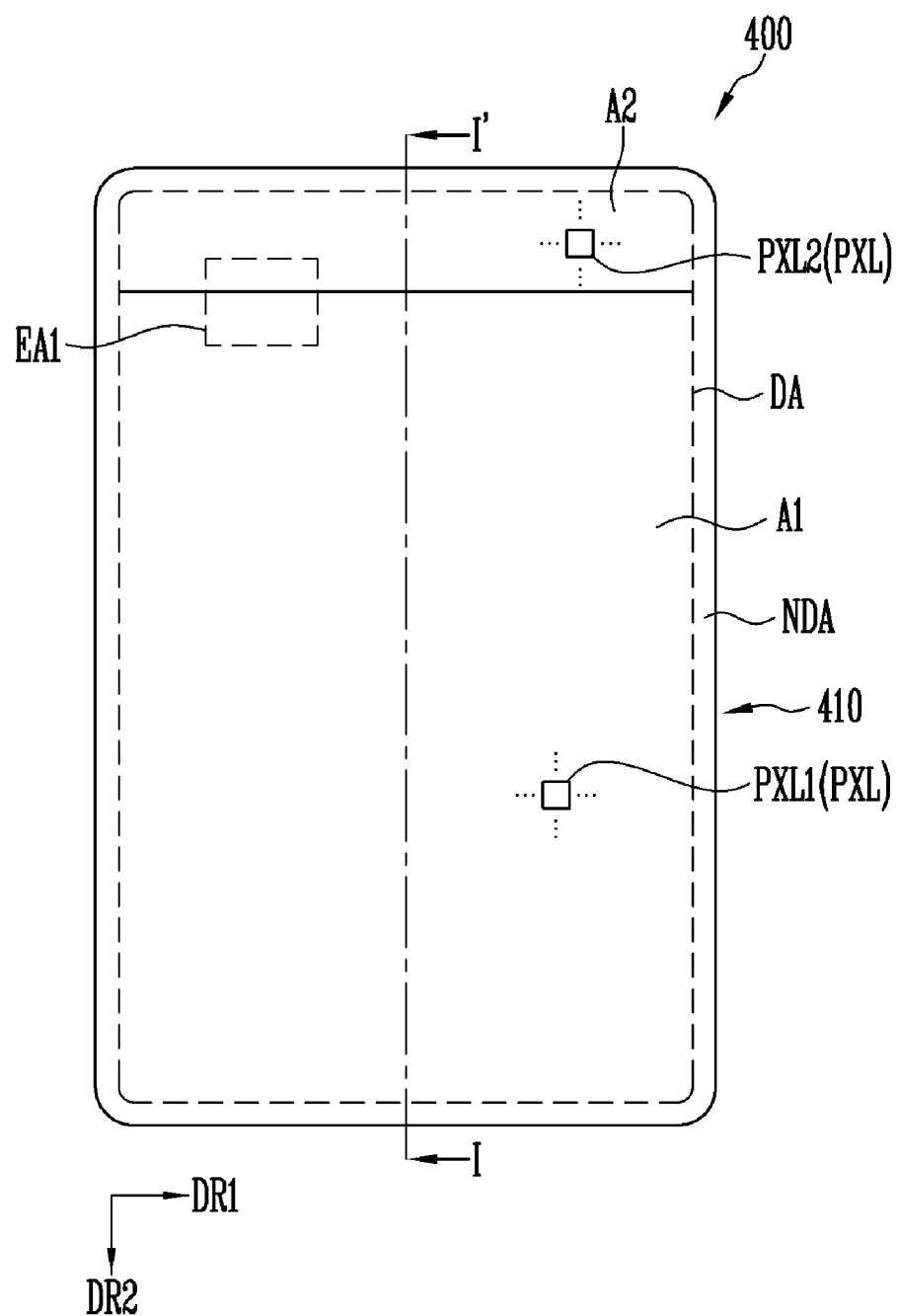
FIGS. 4A and 4B are plan views briefly illustrating an electronic device in accordance with an exemplary embodiment of the present disclosure.
Figure 4B:
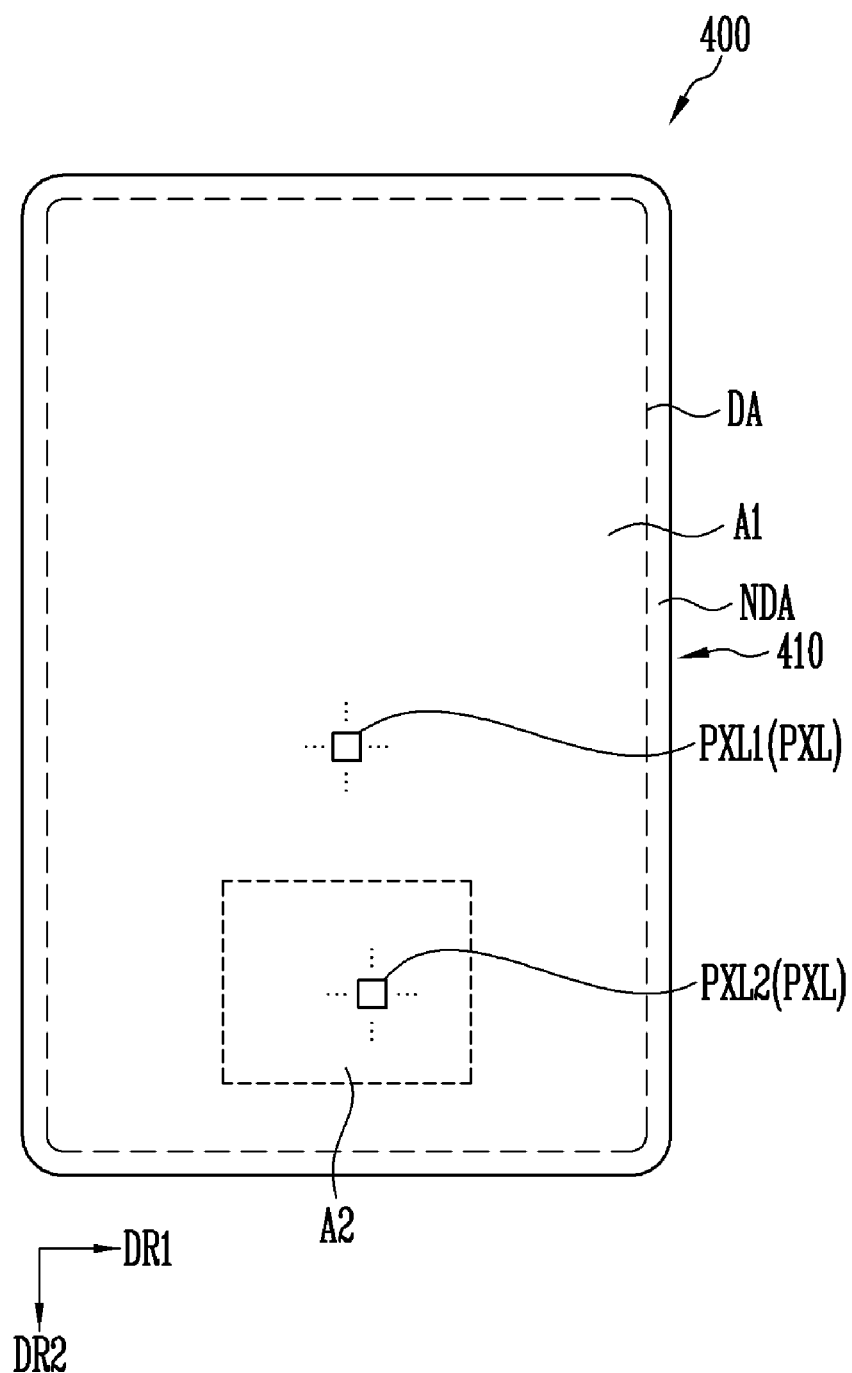

FIGS. 4A and 4B are plan views briefly illustrating an electronic device in accordance with an exemplary embodiment of the present disclosure. FIG. 5 is a sectional view taken along line I-I' shown in FIG. 4A.

Referring to FIGS. 1 to 5, the whole or at least a portion of the electronic device 400 may have flexibility. In an example, the electronic device 400 may have flexibility in the entire region or have flexibility in a region corresponding to a flexible region. When the whole of the electronic device 400 has flexibility, the electronic device 400 may be a rollable display device. When a portion of the electronic device 400 has flexibility, the electronic device 400 may be a foldable display device, but the present disclosure is not limited thereto.

The electronic device 400 may include a display panel 410, a touch sensor 440, a window 450, and at least one component 460.

The display panel 410 may be disposed at a front surface of the electronic device 400.

The display panel 410 displays arbitrary visual information, e.g., a text, a video, a picture, a two-dimensional or three-dimensional image, or the like on a front surface (e.g., an image display surface). The kind of the display panel 410 is not particularly limited to that which displays an image. The display panel 410 may be a self-luminescent display panel such as an Organic Light Emitting Display panel (OLED panel). Alternatively, the display panel 410 may be a non-self-luminescent display panel such as a Liquid Crystal Display panel (LCD panel), an Electro-Phoretic Display panel (EPD panel), or an Electro-Wetting Display panel (EWD panel). When the non-self-luminescent display panel is used as the display panel 410 of the electronic device 400 in accordance with the embodiment of the present disclosure, the electronic device 400 may further include a backlight unit which supplies light to the display panel 410. In an exemplary embodiment, a situation where the display panel 410 is an OLED panel is described as an example. However, the kind of the display panel 410 is not limited thereto, and another display panel may be used within a range (or limit) according to the concepts of the present disclosure. In an embodiment of the present disclosure, the display panel 410 may have the same configuration as the display portion 310 included in the electronic device 300 shown in FIG. 3A.

The display panel 410 may include a display region DA and a non-display region NDA surrounding at least one side of the display region DA.

A plurality of pixels PXL may be provided in the display region DA. In some embodiments, each of the pixels PXL may include at least one light emitting device. In some embodiments, the light emitting device may be a light emitting unit including an organic light emitting diode or subminiature inorganic light emitting diodes having a size in a micro or nano scale range, but the present disclosure is not limited thereto. The display panel 410 may drive the pixels PXL, corresponding to input image data, to display an image in the display region DA. The display region DA may be disposed as a large screen so as to occupy the entire of the front surface of the electronic device 400.

The non-display region NDA is a region surrounding at least one side of the display region DA, and may be the other region except the display region DA. In some embodiments, the non-display region NDA may include a line region, a pad region, and/or various dummy regions.

In an embodiment of the present disclosure, the display region DA may be disposed at the entire of the front surface of the electronic device 400 as shown in FIGS. 4A and 4B. When the display region DA is disposed at the entire of the front surface, the non-display region NDA is not disposed at the front surface or may be disposed in a very narrow area at the front surface. In an example, the display region DA may be in contact with a side edge of the electronic device 400 or be disposed at a distance of 1 mm or less from the side edge. Although a situation where the display region DA is disposed at only the front surface of the electronic device 400 is illustrated in FIGS. 4A and 4B, the present disclosure is not limited thereto. In some embodiments, the display region DA may be disposed in at least one region of the side edge of the electronic device 400, at least one region of a rear surface, or the like. Display regions DA disposed at a plurality of surfaces of the electronic device 400 may be connected to each other at at least a portion or be separated from each other.

In an embodiment of the present disclosure, the electronic device 400 may include at least one component 460 disposed to overlap with at least a portion of the display region DA. The component 460 may be disposed under the pixels PXL and/or lines, which are disposed in the display region DA, to be concealed with respect to the front surface of the electronic device 400. When the component 460 is disposed to overlap with the display region DA under the display region DA, the appearance of the electronic device 400, particularly, the appearance of a front surface corresponding to the display region DA becomes beautiful, and the display region DA can be more widely secured.

In an embodiment of the present disclosure, the display region DA may include a first display region A1 and a second display region A2, which are divided along one direction, e.g., a second direction DR2 as shown in FIG. 4A. The first display region A1 and the second display region A2 may be connected adjacent to each other. The first display region A1 and the second display region A2 may have different sizes. In an example, the size of the first display region A1 may be greater than that of the second display region A2.

The first display region A1 may be one region of the display region DA, which does not overlap with the above-described component 460, and the second display region A2 may be another region of the display region DA, which overlaps with the component 460. In some embodiments, the second display region A2 may be provided (or set) to have an area wider than that of the region overlapping with the component 460. For example, the second display region A2 may be widely formed at one end (e.g., an upper end portion) of the electronic device 400 as shown in FIG. 4A. Although a case where at least one second display region A2 is disposed at only an upper end portion of the front surface of the electronic device 400 is illustrated in FIG. 4A, the present disclosure is not limited thereto. In some embodiments, one or more second display regions A2 may be provided, and be disposed to be adjacent or distributed anywhere in the display region DA. For example, in an embodiment in which the display region DA is formed a side edge and/or a rear surface of the electronic device 400, a portion of the second display region A2 may be formed in the display region DA at the side edge and/or the rear surface of the electronic device 400.

In some embodiments, the second display region A2 may be provided in a shape which is located at the center (or middle) of a lower end portion of the display region DA and is surrounded by the first display region A1 as shown in FIG. 4B.

The component 460 disposed to overlap with the second display region A2 may be an optical component. That is, the component 460 may be a component which receives light or emits light. The component 460 may include, for example, a fingerprint scanner, an image capturing device, a strobe, a photo sensor, a proximity sensor, an indicator, a solar panel, or the like. However, the component 460 is not limited to the optical component, and may include various components such as an ultrasonic sensor, a microphone, an environment sensor (e.g., a barometer, a hygrometer, a thermometer, a radiation detection sensor, a thermal sensor, etc.), and a chemical sensor (e.g., a gas sensor, a dust sensor, an odor sensor, etc.). In an embodiment of the present disclosure, the component 460 may include a plurality of sensors overlapping with the second display region A2. The plurality of sensors may include a camera, a proximity sensor, and an illuminance sensor, which are disposed in a line.

The above-described component 460 may be disposed on a separate substrate made of a plastic or metallic material, such as a bracket or a case, which is not shown, by using a Surface Mount Device (SMD) method to face (or correspond to) at least one region, e.g., the second display region A2 of the display region DA.

The second display region A2 may allow a signal (e.g., light or beam) input to the component 460 to be transmitted therethrough. The second display region A2 may have a transmittance higher than that of the first display region A1 so as to improve the transmittance of the signal. Each of the transmittance of the second display region A2 and the transmittance of the first display region A1 may be a degree to which light is transmitted per unit area (, predetermined area, or the same area). For example, the transmittance may be a ratio of light transmitted through the display panel 410 to light incident into a unit area of the display panel 410. Thus, the second display region A2 having a relatively high transmittance enables a signal (e.g., light or beam) to be well transmitted therethrough, as compared with the first display region A1. For example, as compared with the first display region A1, pixels PXL may be disposed at a low density in the second display region A2. A gap between the pixels PXL disposed at the low density forms a physical and/or optical opening, e.g., a transmission window, to enable a signal (e.g., light or beam) to be better transmitted therethrough.

A plurality of pixels PXL may be disposed in the first display region A1 and the second display region A2. In an example, a plurality of first pixels PXL1 in the first display region A1, and a plurality of second pixels PXL2 may be disposed in the second display region A2. Each of the first and second pixels PXL1 and PXL2 may include a light emitting device which emits light. The light emitting device may be, for example, an organic light emitting diode, but the present disclosure is not limited thereto. In some embodiments, the light emitting device may be an inorganic light emitting device including an inorganic light emitting material or a light emitting device (quantum dot display element) which emits light by changing the wavelength of light emitted using a quantum dot. In an embodiment of the present disclosure, each first pixel PXL1 and each second pixel PXL2 may be different from each other. This will be described in detail later.

The display panel 410 may include a substrate 420 and a display module 430 provided on the substrate 420.

The substrate 420 is a base substrate of the display panel 410, and may be a transmissive substrate which is substantially transparent. In some embodiments, the substrate 420 may be a rigid substrate including glass or tempered glass, or a flexible substrate made of a plastic material. In an embodiment of the present disclosure, the substrate 420 may be a flexible substrate. The component 460 may be provided on a back surface of the substrate 420.

The display module 430 may display, as an image, information input by a user or information provided to the user. In other words, the display module 430 may display, as an image, data input by the user and a result and a reaction, which are obtained by performing an operation according to the data. To this end, the display module 430 may display an image by using the plurality of pixels PXL provided on the substrate 420. The above-described display module 430 will be described in detail later.

The touch sensor 440 and the window 450 may be disposed on the display panel 410 including the above-described components.

The touch sensor 440 may include touch electrodes, and be disposed on the image display surface of the display panel 410 to receive a touch input and/or a hovering input of a user. The touch sensor 440 may recognize a touch input and/or a hovering input of the electronic device 400 by sensing a touch capacitance through contact and/or proximity of a separate input means such as a hand of the user or a conductor similar thereto. The touch input may mean that the electronic device 400 is directly touched (or in direct contact with) by the hand of the user or the separate input means, and the hovering input may mean that the hand of the user or the separate input means is in the vicinity of the electronic device 400 including the touch sensor 440 but does not touch the electronic device 400.

Also, the touch sensor 440 may sense a touch operation of the user, and move an object displayed in the electronic device 400 from an originally displayed position to another position in response to the touch operation. The touch operation may include at least one of a single touch, a multi-touch, and a touch gesture. In an example, various touch operations may exist, which include a specific gesture of enlarging or reducing a text or an image by moving a finger of the user at a certain distance in a state in which the finger of the user touches a touch surface of the touch sensor 440.

The window 450 is a member disposed at an uppermost end of the electronic device 400 including the display panel 410, and be a transmissive substrate which is substantially transparent. The window 450 reduces an external impact while allowing an image from the display panel 410 to be transmitted therethrough, so that the display panel 410 can be prevented from being damaged or malfunctioning due to the external impact. The external impact is a force from the outside, which may be expressed as pressure, stress or the like, and may mean a force which can cause a defect of the display panel 410. The window 450 may include a rigid or flexible substrate, and the material constituting the window 450 is not particularly limited.

Figure 6:
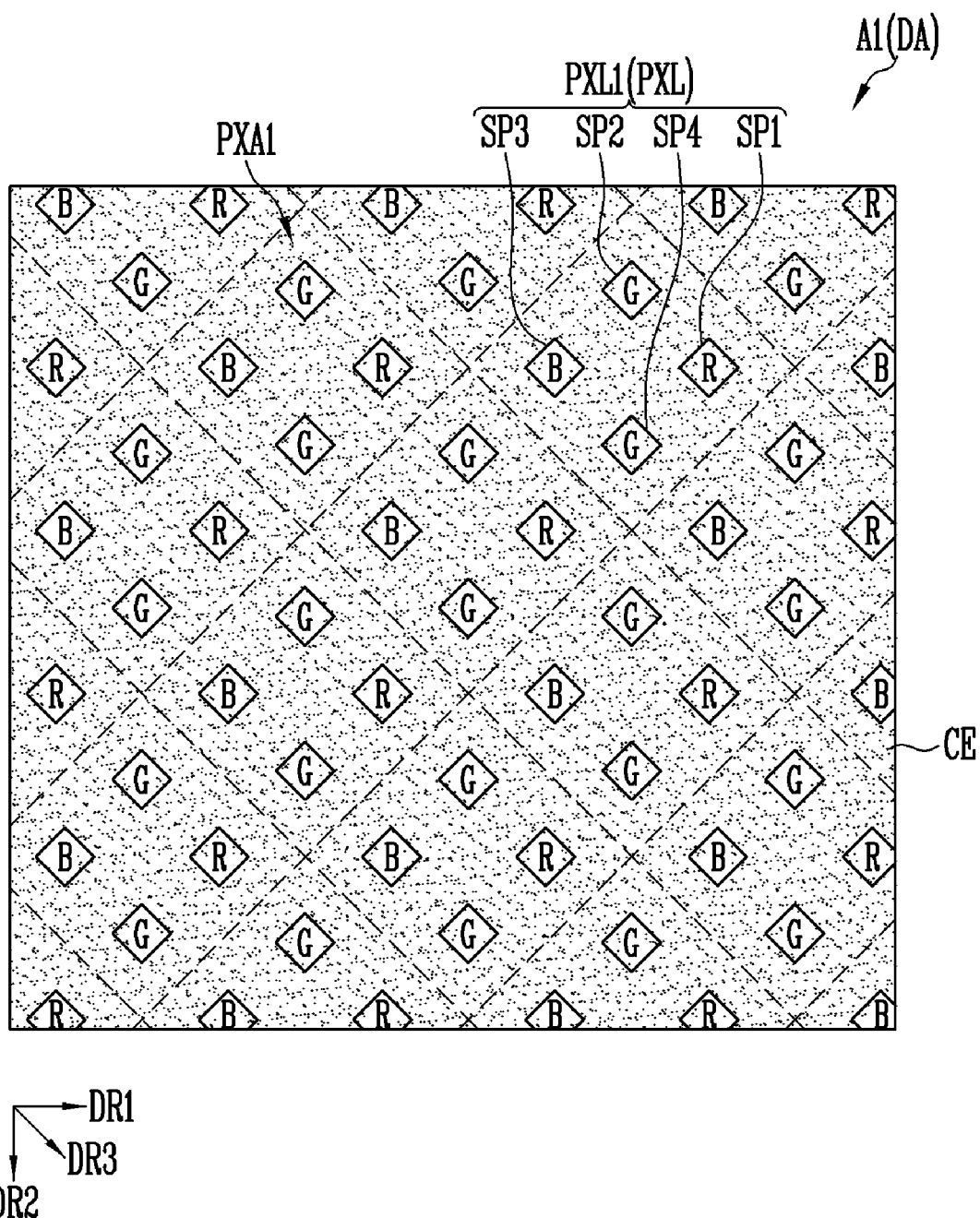
FIG. 6 is a plan view schematically illustrating a first display region in accordance with an embodiment of the present disclosure.
Figure 7:
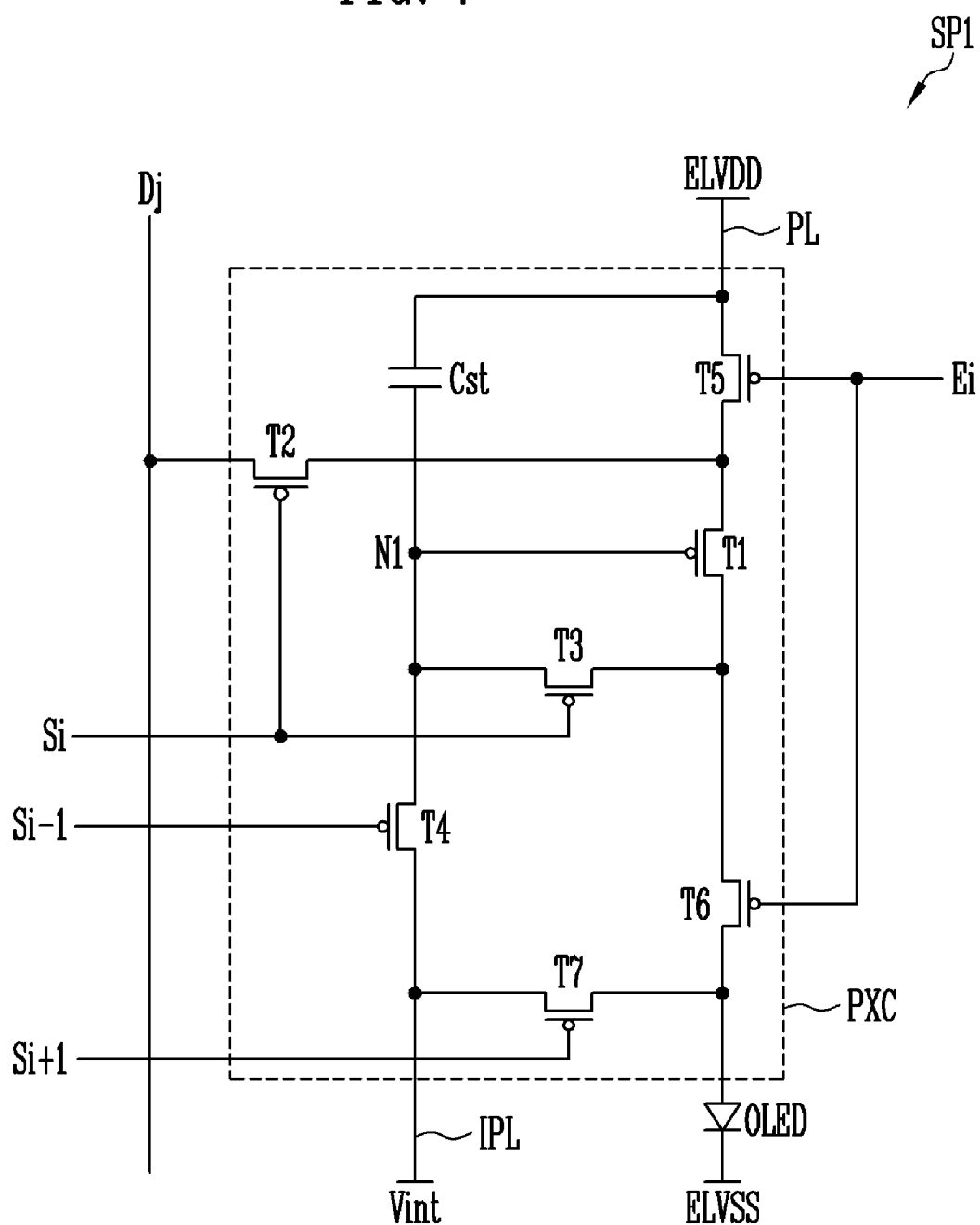
FIG. 7 is a circuit diagram illustrating an embodiment of an electrical connection relationship of components included in a first sub-pixel shown in FIG. 6.

FIG. 6 is a plan view schematically illustrating a first display region in accordance with an embodiment of the present disclosure. FIG. 7 is a circuit diagram illustrating an embodiment of an electrical connection relationship of components included in a first sub-pixel shown in FIG. 6.

In FIG. 7, an active type sub-pixel, e.g., a first sub-pixel shown in FIG. 6 is illustrated, which is connected to an ith scan line Si and an ith emission control line Ei, which are disposed on an ith horizontal pixel column of the first display region A1, and a jth data line Dj disposed on a jth vertical pixel column of the first display region A1, and includes seven transistors.

Referring to FIGS. 1 to 7, the first display region A1 is one region of the display region DA, and a plurality of first pixels PXL1 may be arranged in the first display region A1.

Each first pixel PXL1 may include at least one sub-pixel. In an example, the first pixel PXL1 may include four sub-pixels SP1, SP2, SP3, and SP4. Specifically, the first pixel PXL1 may include a first sub-pixel SP1, a second sub-pixel SP2, a third sub-pixel SP3, and a fourth sub-pixel SP4. The first sub-pixel SP1 may be a red pixel which emits red light R, each of the second and fourth sub-pixels SP2 and SP4 may be a green pixel which emits green light G, and the third sub-pixel SP3 may be a blue pixel which emits blue light B.

In the first display region A1, two first sub-pixels SP1 and two third sub-pixels SP3 may be located at four spots in diagonal directions with respect to one of the second and fourth sub-pixels SP2 and SP4. The two first sub-pixels SP1 and the two third sub-pixels SP3 may face each other with the one of the second and fourth sub-pixels SP2 and SP4 as the center, which is interposed therebetween. Each of the first to fourth sub-pixels SP1 to SP4 may have a rhombus structure, and be formed in the same area or in similar areas. However, the present disclosure is not limited thereto, and the first to fourth sub-pixels SP1 to SP4 may have different structures. Some of the first to fourth sub-pixels SP1 to SP4 may have an area (or size) smaller or larger than that of the other sub-pixels.

In an embodiment of the present disclosure, the first display region A1 may include a first unit pixel region PXA1 in which each first pixel PXL1 is disposed. That is, a plurality of first unit pixel regions PXA1 may be arranged in the first display region A1. A predetermined number of the first unit pixel regions PXA1 may be arranged along a first direction DR1 and a second direction DR2 according to a resolution of the display panel 410. When viewed on a plane, each first unit pixel region PXA1 may have a rhombus shape. However, the present disclosure is not limited thereto, and the first unit pixel region PXA1 may include various shapes according to combinations of the sub-pixels included in the first pixel PXL1. Colored light and/or white light may be implemented by a combination of the sub-pixels included in each first unit pixel region PXA1.

In each first unit pixel region PXA1, the second and fourth sub-pixels SP2 and SP4 may be disposed along the same column direction, the first sub-pixel SP1 may be located on a column different from the column on which the second and fourth sub-pixels SP2 and SP4 are disposed, and the third sub-pixel SP3 may be located on another column different from the column on which the second and fourth sub-pixels SP2 and SP4 are disposed. In each first unit pixel region PXA1, the second and fourth sub-pixels SP2 and SP4 may be disposed adjacent to each other along the second direction DR2, and the first and third sub-pixels SP1 and SP3 may be disposed adjacent to each other the first direction DR1 intersecting the second direction DR2.

As shown in FIG. 6, the first pixels PXL1 each including the first to fourth sub-pixels SP1 to SP4 may be disposed at a first density in the first display region A1. The first density may be, for example, a density at which the first pixels PXL1 are densely disposed in the first display region A1, so that the total area of the first display region A1 is substantially equal to an area in which the first pixels PXL1 are disposed. For example, the first density may be about 100%. The first density may be defined as a total number of the first pixels PXL1 per unit area of the first display region A1 (pixel per inch (PPI)).

Each of the first to fourth sub-pixels SP1 to SP4 may include a light emitting device which emits light and a pixel circuit including at least one transistor for driving the light emitting device. The pixel circuits of the first to fourth sub-pixels SP1 to SP4 may have substantially similar structures or the same structure. Accordingly, for convenience of description, a description of the pixel circuit of each of the first to fourth sub-pixels SP1 to SP4 will be replaced with that of a pixel circuit PXC of the first sub-pixel SP1 with reference to FIG. 7.

As shown in FIG. 7, the first sub-pixel SP1 may include a light emitting element OLED and a pixel circuit PXC connected to the light emitting element OLED to drive the light emitting element OLED. The pixel circuit PXC may include first to seventh transistors T1 to T7 and a storage capacitor Cst. However, in the present disclosure, the components included in the pixel circuit PXC of the first sub-pixel SP1 are not limited to the above-described embodiment.

A first electrode of the first transistor T1 (driving transistor) may be connected to a first power source ELVDD via the fifth transistor T5, and a second electrode of the first transistor T1 may be connected to an anode electrode of the light emitting element OLED via the sixth transistor T6. In addition, a gate electrode of the first transistor T1 may be connected to a first node N1. The first transistor T1 may control an amount of current flowing from the first power source ELVDD to a second power source ELVSS via the light emitting element OLED, corresponding to a voltage of the first node N1.

The second transistor T2 (switching transistor) may be connected between a jth data line Dj and the first electrode of the first transistor T1. In addition, a gate electrode of the second transistor T2 may be connected to an ith scan line Si. The second transistor T2 may be turned on when a scan signal is supplied to the ith scan line Si, to electrically connect the jth data line Dj and the first electrode of the first transistor T1.

The third transistor T3 may be connected between the second electrode of the first transistor T1 and the first node N1. In addition, a gate electrode of the third transistor T3 may be connected to the ith scan line Si. The third transistor T3 may be turned on when a scan signal having a gate-on voltage is supplied to the ith scan line Si, to electrically connect the second electrode of the first transistor T1 and the first node N1. Therefore, when the third transistor T3 is turned on, the first transistor T1 may be diode-connected.

The fourth transistor T4 (initialization transistor) may be connected between the first node N1 and an initialization power source Vint. In addition, a gate electrode of the fourth transistor T4 may be connected to an (i−1)th scan line Si−1. The fourth transistor T4 may be turned on when a scan signal is supplied to the (i−1)th scan line Si−1, to supply a voltage of the initialization power source Vint to the first node N1.

In FIG. 7, an embodiment in which the (i−1)th scan line Si−1 is used as an initialization control line for initializing a gate node of the first transistor T1, i.e., the first node N1 is illustrated. However, the technical concept of the present disclosure is not limited thereto. For example, in another embodiment of the present disclosure, another control line such as an (i−2)th scan line (not shown) may be used as the initialization control line for controlling the gate node of the first transistor T1.

The fifth transistor T5 may be connected between the first power source ELVDD and the first transistor T1. In addition, a gate electrode of the fifth transistor T5 may be connected to an ith emission control line Ei. The fifth transistor T5 may be turned off when an emission control signal having a gate-off voltage is supplied to the ith emission control line, and be turned on in other cases.

The sixth transistor T6 may be connected between the first transistor T1 and the light emitting element OLED. In addition, a gate electrode of the sixth transistor T6 may be connected to the ith emission control line Ei. The sixth transistor T6 may be turned off when an emission control signal having a gate-off voltage (e.g., a high level voltage) is supplied to the ith emission control line Ei, and be turned on in other cases.

The seventh transistor T7 may be connected between the initialization power source Vint and a first electrode, e.g., the anode electrode of the light emitting element OLED. In addition, a gate electrode of the seventh transistor T7 may be connected to an (i+1)th scan line Si+1. The seventh transistor T7 may be turned on when a scan signal having a gate-on voltage (e.g., a low level voltage) is supplied to the (i+1)th scan line Si+1, to supply the voltage of the initialization power source Vint to the anode electrode of the light emitting element OLED. The voltage of the initialization power source Vint may be set to a voltage lower than that of a data signal. That is, the voltage of the initialization power source Vint may be set to the lowest voltage or less of the data signal.

Although a case where an anode initialization control line to which the gate electrode of the seventh transistor T7 is connected is the (i+1)th scan line Si+1 is illustrated in FIG. 7, the technical concept of the present disclosure is not limited thereto. For example, in another embodiment of the present disclosure, the gate electrode of the seventh transistor T7 may be connected to the ith scan line Si. Therefore, when a scan signal having a gate-on voltage is supplied to the ith scan line Si, the voltage of the initialization power source Vint may be supplied to the anode electrode of the light emitting element OLED via the seventh transistor T7.

The storage capacitor Cst may be connected between the first power source ELVDD and the first node N1. The storage capacitor Cst may store a voltage corresponding to the data signal and a threshold voltage of the first transistor T1.

The anode electrode of the light emitting element OLED may be connected to the first transistor T1 via the sixth transistor T6, and a cathode electrode of the light emitting element OLED may be connected to the second power source ELVSS. The light emitting element OLED generates light with a predetermined luminance corresponding to an amount of current supplied from the first transistor T1. A voltage value of the first power source ELVDD may be set higher than that of the second power source ELVSS such that a current can flow through the light emitting element OLED.

The light emitting element OLED may be, for example, an organic light emitting diode. The light emitting element OLED may emit light of one of red, green, and blue. However, the present disclosure is not limited thereto.

Meanwhile, the structure of the first sub-pixel SP1 is not limited to the embodiment shown in FIG. 7. For example, it will be apparent that the pixel circuit PXC having various structures currently known in the art may be applied to the first sub-pixel SP1.

Figure 8:
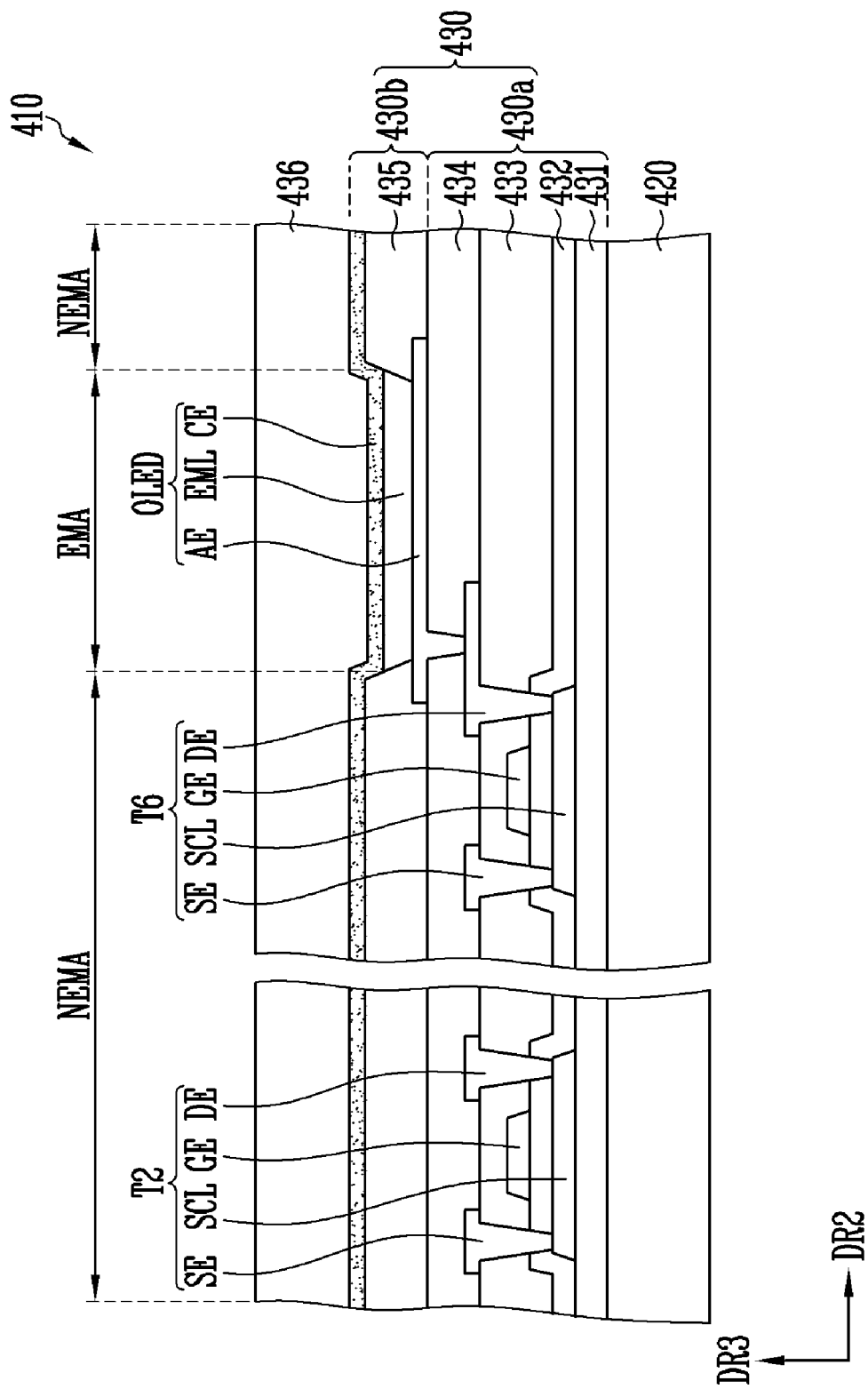
FIG. 8 is a schematic sectional view of a display panel shown in FIG. 5.

FIG. 8 is a schematic sectional view of the display panel shown in FIG. 5.

In FIG. 8, only a section of a portion corresponding to each of the second and sixth transistors T2 and T6 among the first to seventh transistors T1 to T7 shown in FIG. 7 is illustrated for convenience of description.

Referring to FIGS. 1 to 8, the display panel 410 may include a substrate 420, a display module 430, and a thin film encapsulation layer 436.

The substrate 420 may include a transparent insulating material to enable light to be transmitted therethrough. The substrate 420 may have a single- or multi-layered structure.

The substrate 420 may be a rigid substrate. For example, the rigid substrate may be one of a glass substrate, a quartz substrate, a glass ceramic substrate, and a crystalline glass substrate.

The substrate 420 may be a flexible substrate. The flexible substrate may be one of a film substrate and a plastic substrate, which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate 420 is not limited to the above-described embodiment, and may be variously changed.

The display module 430 may include a pixel circuit layer 430a disposed on the substrate 420 and a display element layer 430b disposed on the pixel circuit layer 430a. The pixel circuit layer 430a may include a pixel circuit PXC including at least one insulating layer and at least one transistor. The display element layer 430b may include at least one light emitting element OLED which emits light.

The pixel circuit layer 430a may include a buffer layer 431, second and sixth transistors T2 and T6, and a passivation layer 434.

The buffer layer 431 may be disposed on the substrate 420, and prevent an impurity from being diffused into the second and sixth transistors T2 and T6. The buffer layer 431 may be provided in a single layer, but be provided in a multi-layer including at least two layers. The buffer layer 431 may be omitted according to the material and process conditions of the substrate 420.

Each of the second and sixth transistors T2 and T6 may include a semiconductor layer SCL, a gate electrode GE, a first terminal SE, and a second terminal DE. The first terminal SE may be any one of a source electrode and a drain electrode, and the second terminal DE may be the other of the source electrode and the drain electrode. In an example, when the first terminal SE is the source electrode, the second terminal DE may be the drain electrode. Each of the first, third to fifth, and seventh transistors T1, T3 to T5, and T7 included together with the second and sixth transistors T2 and T6 in the pixel circuit PXC of one sub-pixel may include a semiconductor layer SCL, a gate electrode GE, a first terminal SE, and a second terminal DE.

The semiconductor layer SCL of each of the second and sixth transistors T2 and T6 may be disposed and/or formed on the buffer layer 431. The semiconductor layer SCL may include a first region in contact with the first terminal SE and a second region in contact with the second terminal DE. A region between the first region and the second region may be a channel region. The semiconductor layer SCL may be a semiconductor pattern made of poly-silicon, amorphous silicon, oxide semiconductor, etc. The channel region is a semiconductor pattern undoped with an impurity, and may be an intrinsic semiconductor. Each of the first region and the second region may be a semiconductor pattern doped with the impurity. The impurity may include impurities such as an n-type impurity, a p-type impurity, and other metals.

The gate electrode GE of each of the second and sixth transistors T2 and T6 may be disposed and/or formed on a corresponding semiconductor layer SCL with a gate insulating layer 432 interposed therebetween.

The first terminal SE and the second terminal DE of each of the second and sixth transistors T2 and T6 may be respectively in contact with the first region and the second region of the corresponding semiconductor layer SCL through contact holes penetrating an interlayer insulating layer 433 and the gate insulating layer 432.

Although a case where the first and second terminals SE and DE of each of the second and sixth transistors T2 and T6 are separate electrodes electrically connected to the corresponding semiconductor layer SCL has been described in the above-described embodiment, the present disclosure is not limited thereto. In some embodiments, the first terminal SE of each of the second and sixth transistors T2 and T6 may be one of the first and second regions adjacent to the channel region of the corresponding semiconductor layer SCL, and the second terminal DE of each of the second and sixth transistors T2 and T6 may be the other of the first and second regions adjacent to the channel region of the corresponding semiconductor layer SCL. The second terminal DE of each of the second and sixth transistors T2 and T6 may be electrically connected to the light emitting element OLED of a corresponding sub-pixel through a bridge electrode, a contact electrode, or the like.

Each of the second and sixth transistors T2 and T6 may be configured as an LTPS thin film transistor, but the present disclosure is not limited thereto. In some embodiments, each of the second and sixth transistors T2 and T6 may be configured as an oxide semiconductor thin film transistor. In addition, although a case where each of the second and sixth transistors T2 and T6 is a thin film transistor having a top gate structure is described as an example, the present disclosure is not limited thereto. In some embodiments, each of the second and sixth transistors T2 and T6 may be a thin film transistor having a bottom gate structure.

In an embodiment of the present disclosure, each of the interlayer insulating layer 433 and the gate insulating layer 432 may be an inorganic insulating layer including an inorganic material or an organic insulating layer including an organic material.

The passivation layer 434 may be provided and/or formed over the second and sixth transistors T2 and T6 to cover the second and sixth transistors T2 and T6.

The display element layer 430b may include the light emitting element OLED which is provided on the passivation layer 434 and emits light.

The light emitting element OLED may include first and second electrodes AE and CE, and an emitting layer EML disposed between the two electrodes AE and CE. Any one of the first and second electrodes AE and CE may be an anode electrode, and the other of the first and second electrodes AE and CE may be a cathode electrode. When the light emitting element OLED is a top-emission organic light emitting element, the first electrode AE may be a reflective electrode, and the second electrode CE may be a transmissive electrode. In an embodiment of the present disclosure, a case where the light emitting element OLED is the top-emission organic light emitting element, and the first electrode AE is the anode electrode is described as an example.

The first electrode AE may be electrically connected to the second electrode DE of the sixth transistor T6 through the fifth contact hole penetrating the passivation layer 434. The first electrode AE may include a reflective layer (not shown) capable of reflecting light and a transparent conductive layer (not shown) disposed on the top or bottom of the reflective layer. At least one of the transparent conductive layer and the reflective layer may be electrically connected to the second electrode DE of the sixth transistor T6.

The display element layer 430b may further include a pixel defining layer 435 having an opening exposing a portion of the first electrode AE, e.g., an upper surface of the first electrode AE.

Each of the first to fourth sub-pixels SP1 to SP4 included in each first unit pixel region PXA1 in the first display region A1 may include an emission region EMA and a non-emission region NEMA adjacent to the emission region EMA. The non-emission region NEMA may surround the emission region EMA. In this embodiment, the emission region EMA may be defined corresponding to a partial region of the first electrode AE, which is exposed by the opening, or the emitting layer EML.

The emitting layer EML may be disposed in a region corresponding to the opening of the pixel defining layer 435. That is, the emitting layer EML may be provided to be separated from each of the first to fourth sub-pixels SP1 to SP4. The emitting layer EML may include an organic material and/or an inorganic material. In an embodiment of the present disclosure, a patterned emitting layer EML is exemplarily illustrated. However, in some embodiments, the emitting layer EML may be commonly provided in the pixels PXL. The color of light generated in the emitting layer EML may be one of red, green, blue, and white, but this embodiment is not limited thereto. For example, the color of light generated in the emitting layer EML may be one of magenta, cyan, and yellow.

The second electrode CE may be disposed on the emitting layer EML. The second electrode CE may be commonly provided in the first to fourth sub-pixels SP1 to SP4. The second electrode CE may be provided in a plate shape to entirely correspond to the first display region A1, but the present disclosure is not limited thereto. A hole injection layer (not shown) may be disposed between the first electrode AE and the emitting layer EML, and an electron injection layer (not shown) may be disposed between the emitting layer EML and the second electrode CE. The hole injection layer and the electron injection layer may be commonly provided in the first to fourth sub-pixels SP1 to SP4.

The thin film encapsulation layer 436 may be provided over the second electrode CE. The thin film encapsulation layer 436 may be provided in a single layer, but be provided in a multi-layer. The thin film encapsulation layer 436 may include a plurality of insulating layers covering the light emitting element OLED. Specifically, the thin film encapsulation layer 436 may include at least one inorganic layer and at least one organic layer. For example, the thin film encapsulation layer 436 may have a structure in which inorganic and organic layers are alternately stacked.

Figure 9:
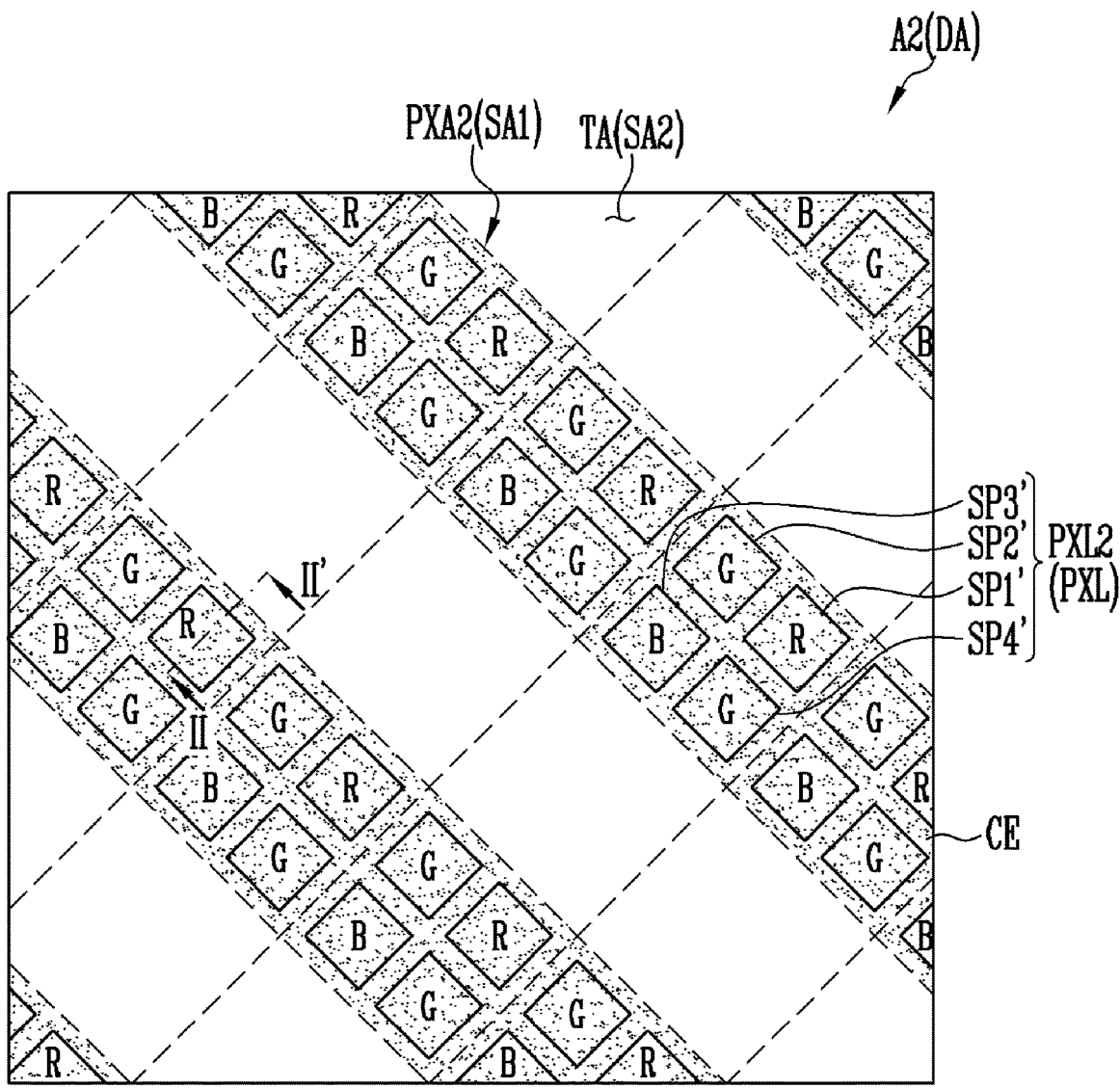
FIG. 9 is a plan view schematically illustrating a second display region in accordance with an embodiment of the present disclosure.
Figure 10:
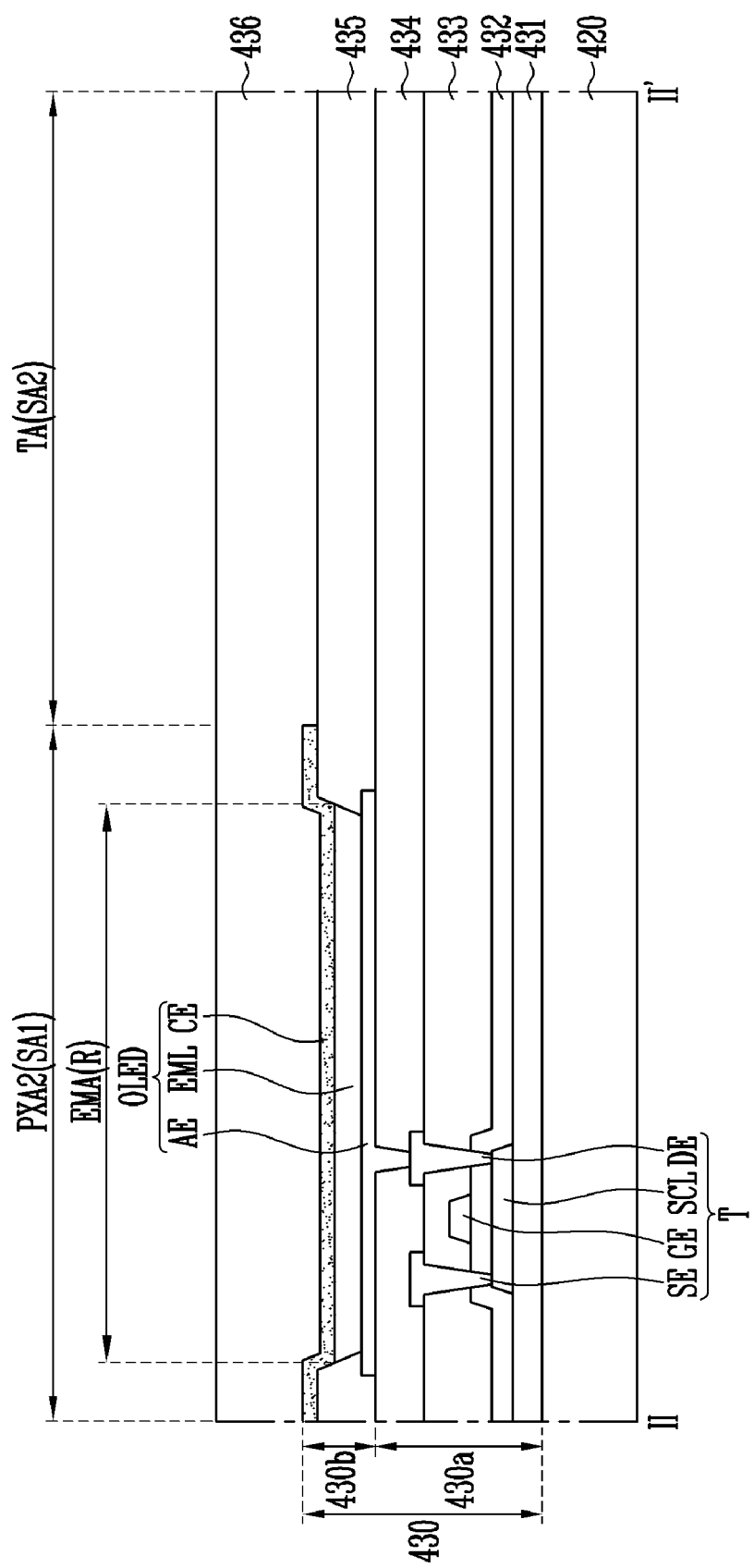
FIG. 10 is a sectional view taken along line II-II' shown in FIG. 9.
Figure 11:
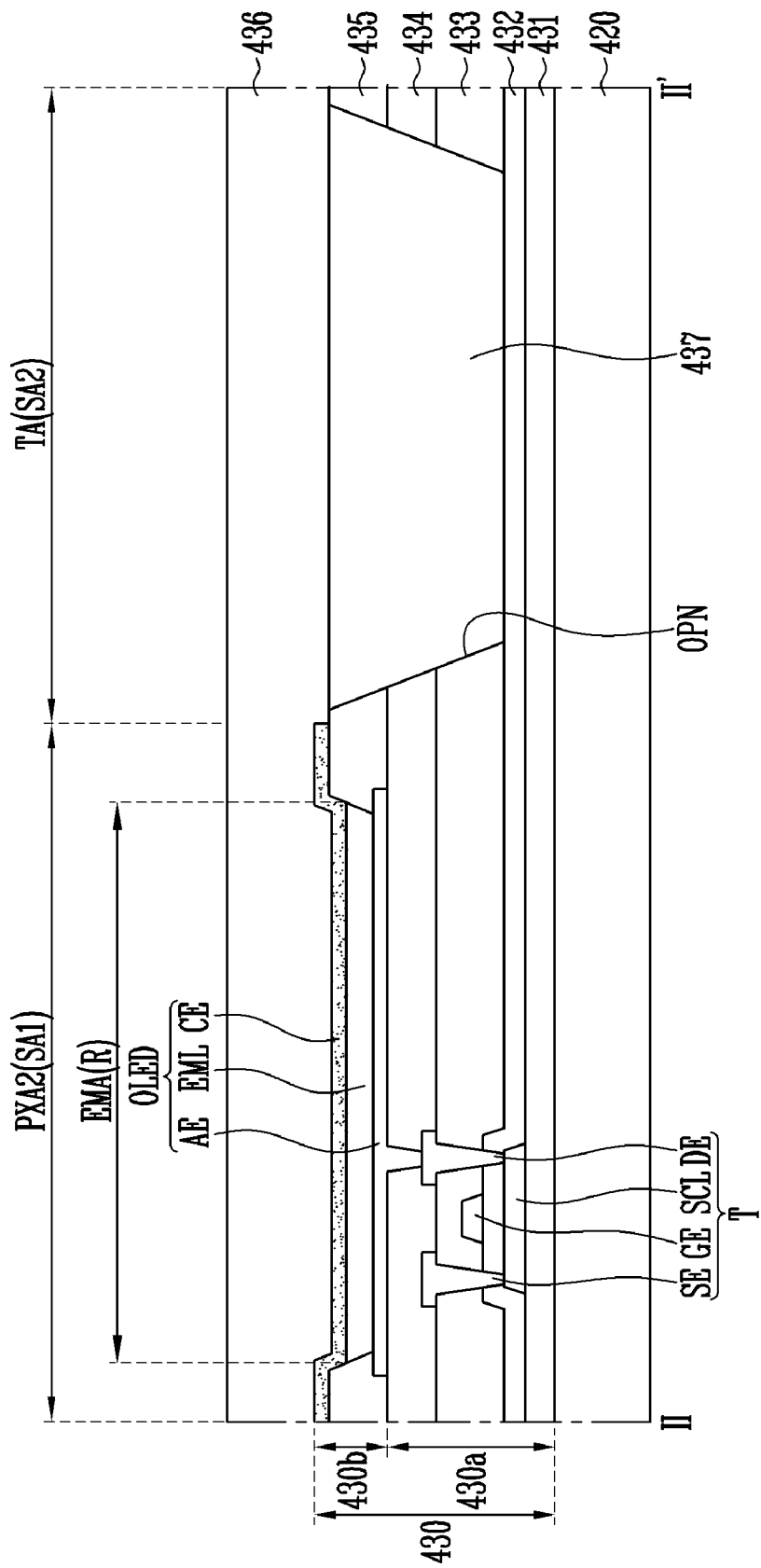
FIG. 11 illustrates another embodiment of a transmissive region shown in FIG. 10, and is a sectional view corresponding to the line II-II' shown in FIG. 9.

FIG. 9 is a plan view schematically illustrating a second display region in accordance with an embodiment of the present disclosure. FIG. 10 is a sectional view taken along line II-II' shown in FIG. 9. FIG. 11 illustrates another embodiment of a transmissive region shown in FIG. 10, and is a sectional view corresponding to the line II-II' shown in FIG. 9. FIGS. 12 to 15 are schematic plan views illustrating other embodiments of the second display region shown in FIG. 9.

Referring to FIGS. 1 to 15, the display panel 410 may include a first display region A1 and a second display region A2, in which pixels PXL are disposed at different densities. That is, the pixels PXL may be disposed at different densities in the first display region A1 and the second display region A2. In an example, first pixels PXL1 may be disposed at a first density in the first display region A1, and second pixels PXL2 may be disposed at a second density in the second display region A2. The second density may be set smaller than the first density.

In an embodiment of the present disclosure, a density (or pixel density) may be defined as a ratio (%) of an area in which pixels PXL are disposed to a total area of a corresponding display region. The area in which the pixels PXL are disposed may be a total sum of respective areas. The area of each pixel PXL may mean the area of a region including a pixel circuit PXC and a light emitting element OLED. In some embodiments, the area of each pixel PXL may mean the area of a light emitting surface of the light emitting element OLED, e.g., the size of an emission region in which light is emitted. For example, the area of each pixel PXL may be the area of a first electrode AE included in the light emitting element OLED or the area of an emitting layer EML included in the light emitting element OLED.

In the following embodiments, the first density is defined as a ratio of an area in which the first pixels PXL1 are disposed to a total area of the first display region A1, and the second density is defined as a ratio of an area in which the second pixels PXL2 are disposed to a total area of the second display region A2.

The second display region A2 may include a plurality of first sub-regions SA1 and a plurality of second sub-regions SA2, which are adjacent to each other and have the same size (or area). In an embodiment of the present disclosure, each first sub-region SA1 is a second unit pixel region PXA2 in which one second pixel PXL2 is disposed, and each second sub-region SA2 is a region in which the second pixel PXL2 is not disposed and is a transmissive region TA through which light is transmitted. In the following embodiment, the first sub-region SA1 is referred to as the second unit pixel region PXA2, and the second sub-region SA2 is referred to as the transmissive region TA.

Each second unit pixel region PXA2 and each transmissive region TA may be alternately disposed along an inclined direction of one of first and second directions DR1 and DR2, e.g., a third direction DR3. The second pixels PXL2 located in the second display region A2 may be arranged along the third direction DR3. In an example, the second pixels PXL2 may be arranged along an oblique direction (i.e., diagonally) in the second display region A2.

In some embodiments, as shown in FIGS. 12 to 15, each second unit pixel region PXA2 and each transmissive region TA may be alternately disposed along the first direction DR1. Also, in some embodiments, each second unit pixel region PXA2 and each transmissive region TA may be alternately disposed along the second direction DR2. Also, in some embodiments, at least two second unit pixel regions PXA2 adjacent to each other and at least two transmissive regions TA adjacent to each other may be alternately disposed along the first direction DR1, the second direction DR2, or the third direction DR3.

As shown in FIG. 9, the second unit pixel regions PXA2 may be repeatedly arranged along the third direction DR3 to constitute a first column, and the transmissive regions TA may be repeatedly arranged along the third direction DR3 to constitute a second column.

Figure 12:
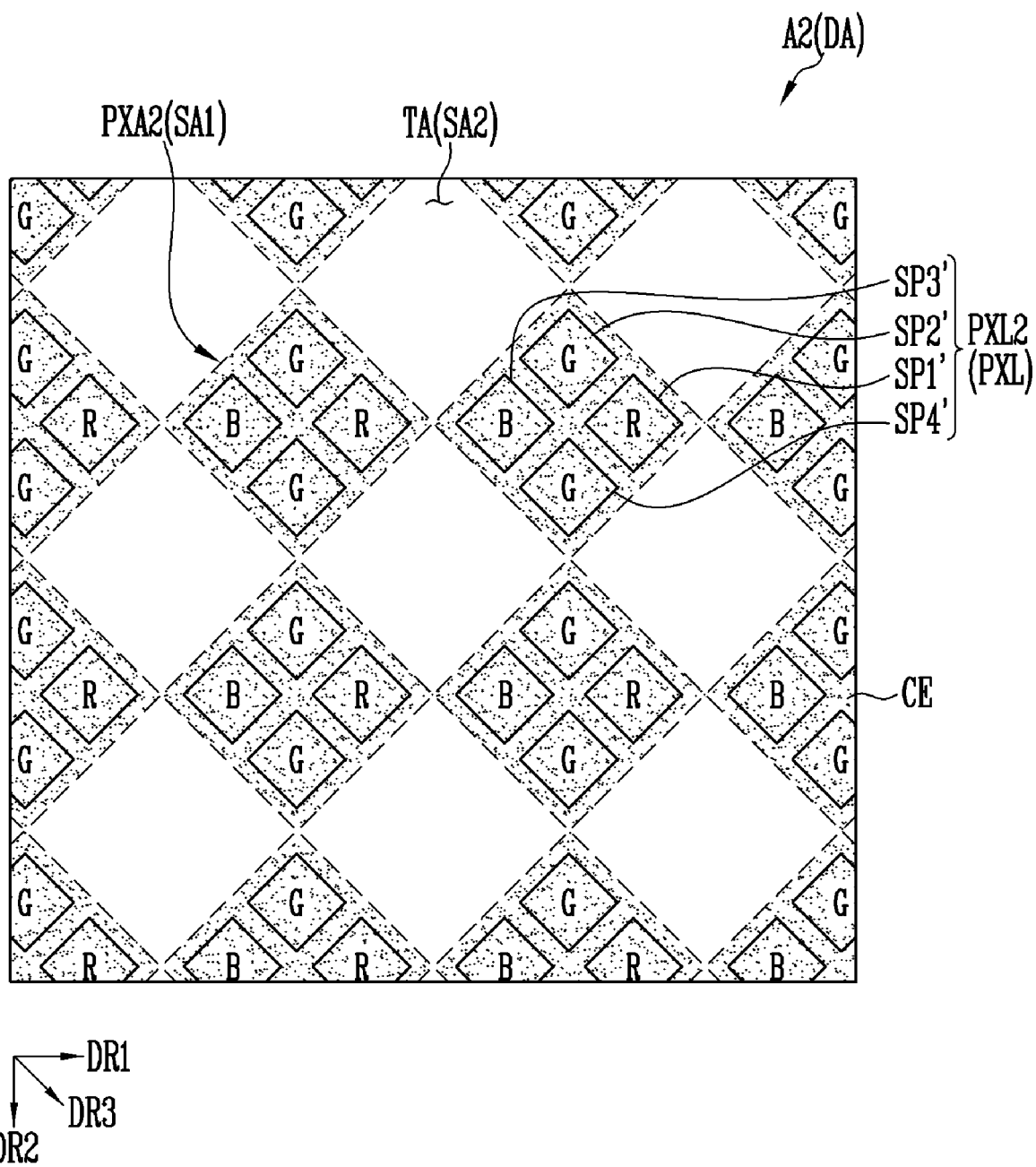
FIGS. 12, 13, 14, and 15 are schematic plan views illustrating other embodiments of the second display region shown in FIG. 9.

In some embodiments, as shown in FIG. 12, the second unit pixel regions PXA2 may be repeatedly arranged along the second direction DR2 to constitute at least one column, and the transmissive regions TA may be repeatedly arranged along the first direction DR1 intersecting the second direction DR2 to constitute at least one row. Also, as shown in FIG. 12, one transmissive region TA may be disposed at each of four spots in diagonal directions with respect to one second unit pixel region PXA2 in the second display region A2. Similarly, one second unit pixel region PXA2 may be disposed at each of four spots in diagonal direction with respect to one transmissive region TA in the second display region A2.

One second pixel PXL2 may include at least one sub-pixel disposed in the second unit pixel region PXA2. In an example, the one second pixel PXL2 may include first to fourth sub-pixels SP1', SP2', SP3', and SP4' disposed in the second unit pixel region PXA2.

In each second unit pixel region PXA2, an arrangement relationship of the first to fourth sub-pixels SP1', SP2', SP3', and SP4' may be identical to that of the first to fourth sub-pixels SP1 to SP4 disposed in each first unit pixel region PXA1. That is, in each second unit pixel region PXA2, the second and fourth sub-pixels SP2' and SP4' may be disposed adjacent to each other along the same column direction, the first sub-pixel SP1' may be located on a column different from that on which the second and the fourth sub-pixels SP2' and SP4' are disposed, and the third sub-pixel SP3' may be located on another column different from that on which the second and the fourth sub-pixels SP2' and SP4' are disposed.

In each second unit pixel region PXA2, the second and the fourth sub-pixels SP2' and SP4' may be disposed adjacent to each other along the second direction DR2, and the first and third pixels SP1' and SP3' may be disposed adjacent to each other along the first direction DR1. Each of the first to fourth sub-pixels SP1' to SP4' may have a rhombus structure, and be formed in the same area or in similar areas. However, the present disclosure is not limited thereto, and the first to fourth sub-pixels SP1' to SP4' may have different structures. Some of the first to fourth sub-pixels SP1' SP4' may have an area (or size) smaller or larger than that of the other sub-pixels.

In an embodiment of the present disclosure, the first sub-pixel SP1' may be a red pixel which emits red light R, each of the second and fourth sub-pixels SP2' and SP4' may be a green pixel which emits green light G, and the third sub-pixel SP3' may be a blue pixel which emits blue light B. However, the present disclosure is not limited thereto. In some embodiments, the first sub-pixel SP1' may be the green pixel which emits the green light G or the blue pixel which emits the blue light B, the second sub-pixel SP2' may be the red pixel which emits the red light R or the blue pixel which emits the blue light B, the third sub-pixel SP3' may be the red pixel which emits the red light R or the green pixel which emits the green light G, and the fourth sub-pixel SP4' may be the red pixel which emits the red light R or the blue pixel which emits the blue light B. One second pixel PXL2 may implement white light by combining lights respectively emitted from the first to fourth sub-pixels SP1' to SP4'. Although a case where the first to fourth sub-pixels SP1' to SP4' constitute one second pixel PXL2 has been described in the above-described embodiment, the present disclosure is not limited thereto. In some embodiments, one second pixel PXL2 may include two sub-pixels or three sub-pixels.

Although a case where each second unit pixel region PXA2 has a rhombus shape is illustrated in FIG. 9, the present disclosure is not limited thereto. In some embodiments, the second unit pixel region PXA2 may have various shapes such as a square shape, a rectangular shape, a hexagonal shape, and an octagonal shape.

Figure 13:
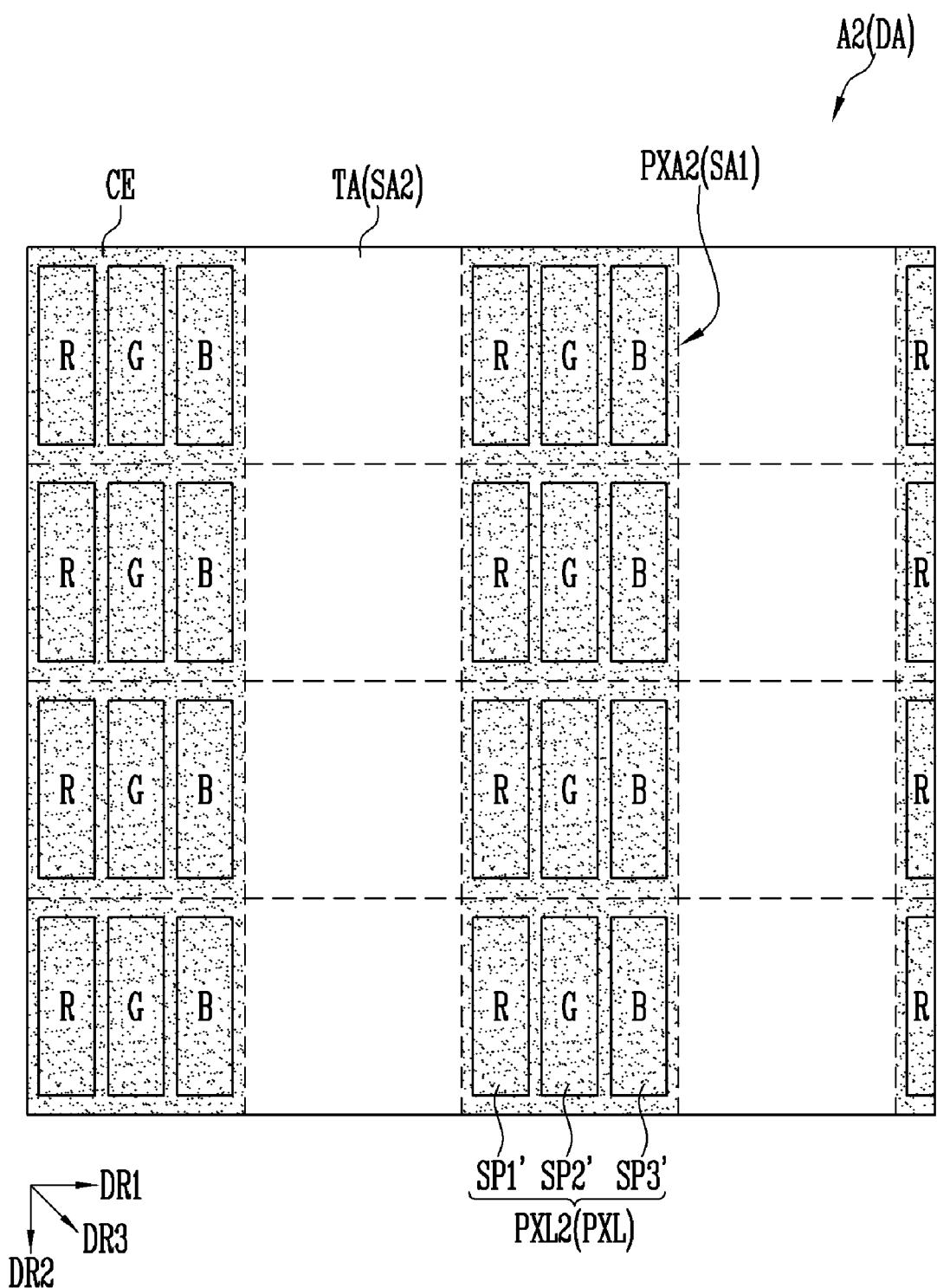

In some embodiments, as shown in FIG. 13, one second pixel PXL2 may include first to third sub-pixels SP1' to SP3' arranged on the same pixel row along the first direction DR1. The first to third sub-pixels SP1' to SP3' may be disposed in an arrangement structure of a stripe shape in each second unit pixel region PXA2. The first sub-pixel SP1' may emit red light R, the second sub-pixel SP2' may emit green light G, and the third sub-pixel SP3' may emit blue light B. The first to third sub-pixels SP1' to SP3' may have a rectangular structure, and be formed in areas (or sizes) equal or similar to one another.

Figure 14:
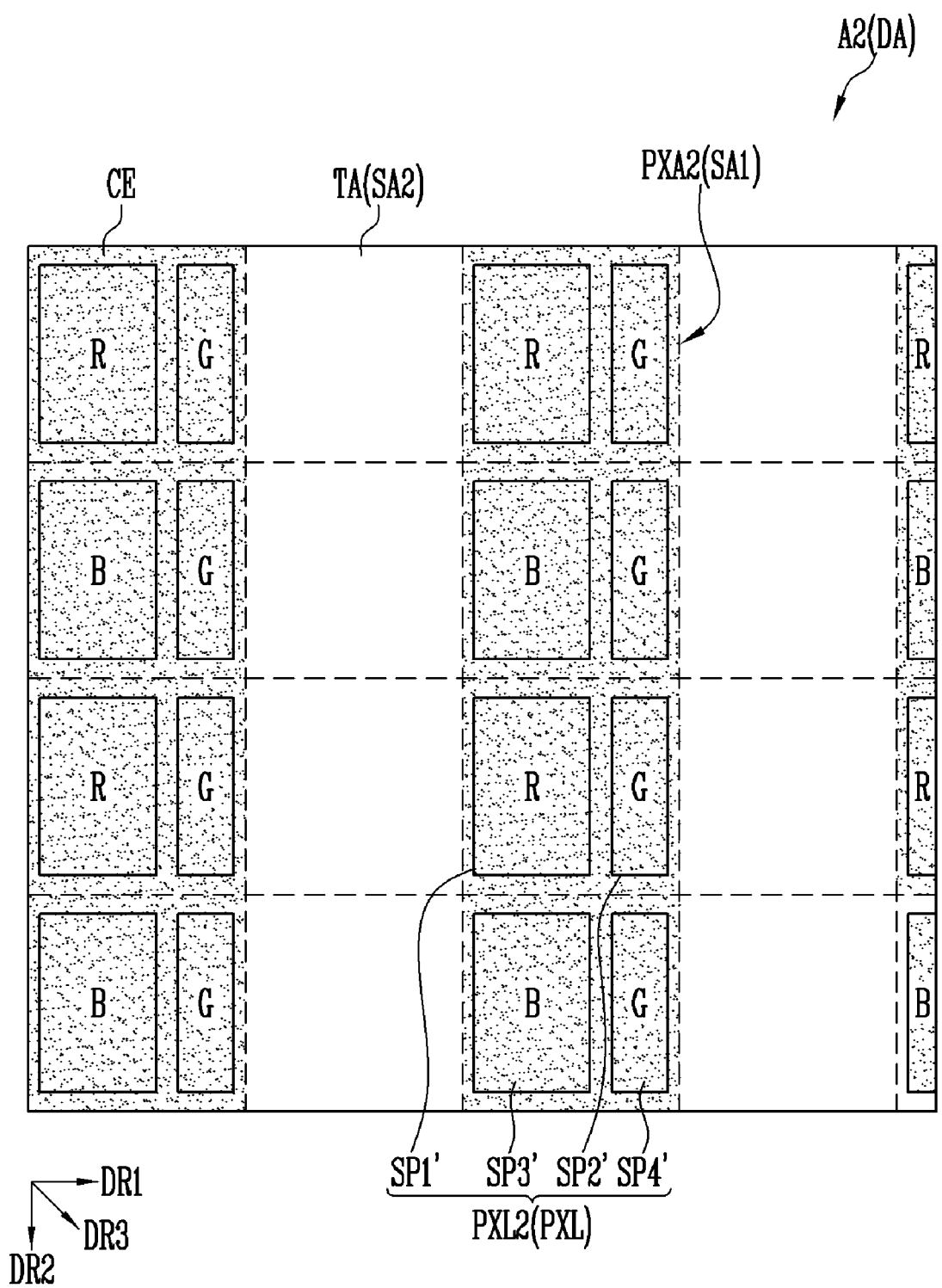
Figure 15:
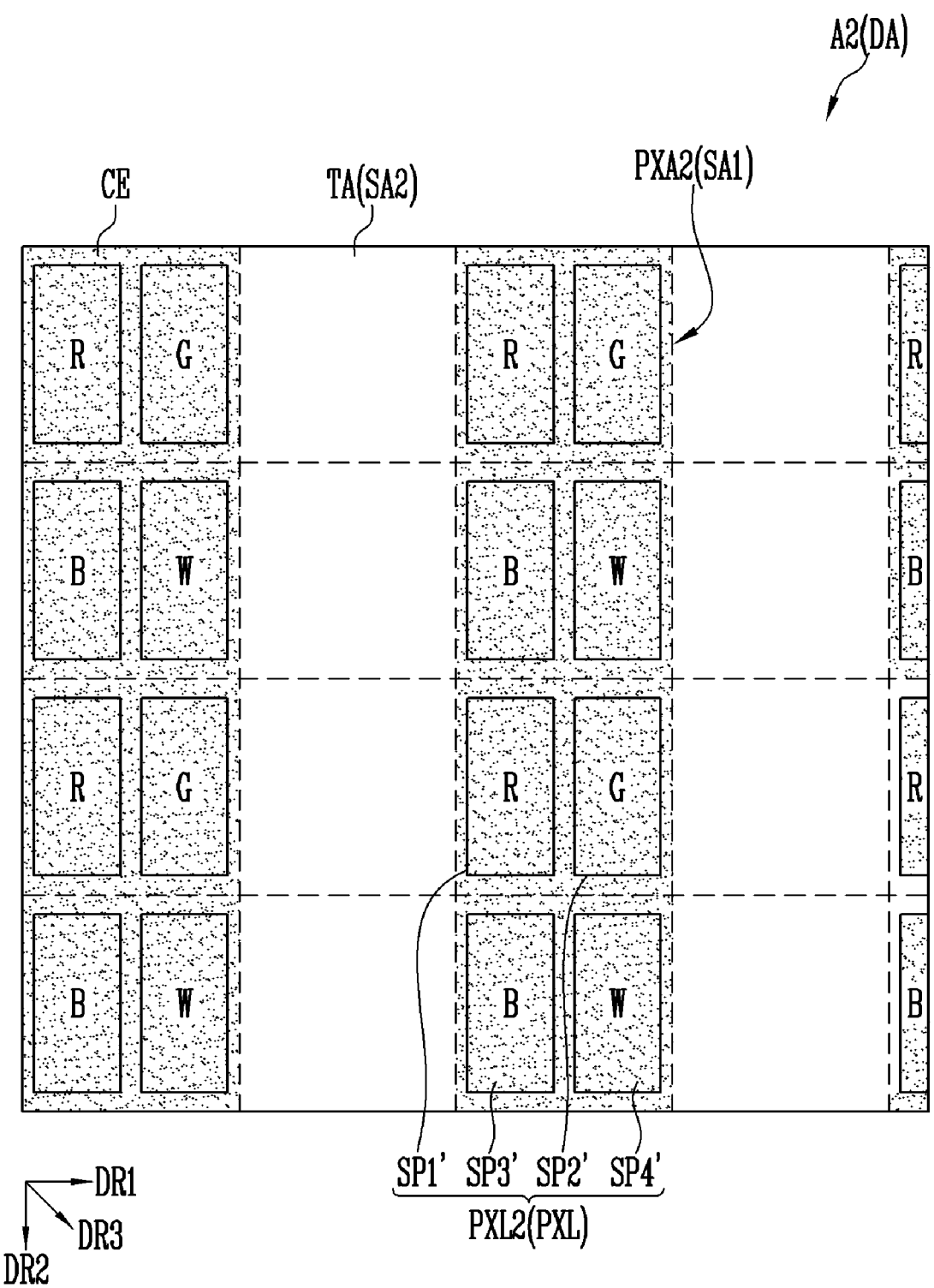

In another embodiment, as shown in FIG. 14, one second pixel PXL2 may include first to fourth sub-pixels SP1' to SP4'. The first sub-pixel SP1' may emit red light R, each of the second and fourth sub-pixels SP2' and SP4' may emit green light G, and the third sub-pixel SP3' may emit blue light B. Among the first to fourth sub-pixels SP1' to SP4', the first and third sub-pixels SP1' and SP3' may be repeatedly disposed in the second direction DR2 (e.g., a 'column direction') in the second display region A2 to constitute one pixel column, and the second and fourth pixels SP2' and SP4' may be repeatedly disposed in the second direction DR2 in the second display region A2 to constitute another pixel column. The first to fourth sub-pixels SP1' to SP4' may form an arrangement structure of a Pentile shape. Although a case where the fourth sub-pixel SP4' emits the green light G has been described in the above-described embodiment, the present disclosure is not limited thereto. In another embodiment, the fourth sub-pixel SP4' may emit white light W as shown in FIG. 15. When the fourth sub-pixel SP4' emits the white light W, the second sub pixel SP2' and the fourth sub-pixel SP4', each of which emits the green light G, may be repeatedly disposed along the second direction DR2 to constitute one pixel column.

Each of the first to fourth sub-pixels SP1' to SP4' may include a pixel circuit layer 430a including at least one transistor and a display element layer 430b including a light emitting element OLED. The first to fourth sub-pixels SP1' to SP4' may have substantially similar structures or have the same structure. Accordingly, a description of a configuration of each of the second to fourth sub-pixels SP2' to SP4' will be replaced with that of a configuration of the first sub-pixel SP1' with reference to FIG. 10.

The first sub-pixel SP1' may include a substrate 420, a pixel circuit layer 430a including a pixel circuit (see PXC shown in FIG. 7) having at least one transistor provided on the substrate 420, a display element layer 430b provided on the pixel circuit layer 430a, and a thin film encapsulation layer 436. The thin film encapsulation layer 436 has the same configuration as the thin film encapsulation layer 436 of the first display region A1 shown in FIG. 8. In FIG. 10, only a driving transistor T for driving the light emitting element OLED is illustrated for convenience of description. The driving transistor T shown in FIG. 10 has the same configuration as the first transistor T1 shown in FIG. 7.

The pixel circuit layer 430*a* may include the driving transistor T and at least one insulating layer. The insulating layer may include a buffer layer 431, a gate insulating layer 432, an interlayer insulating layer 433, and a passivation layer 434, which are sequentially stacked on the substrate 420. The buffer layer 431, the gate insulating layer 432, the interlayer insulating layer 433, and the passivation layer 434 have the same configurations as the buffer layer 431, the gate insulating layer 432, the interlayer insulating layer 433, and the passivation layer 434 of the first display region A1 shown in FIG. 8. The driving transistor T may include a semiconductor layer SCL, a gate electrode GE, and first and second terminals SE and DE, and be configured as a thin film transistor having the same structure as the second and sixth transistors T2 and T6 of the first display region A1 shown in FIG. 8.

The display element layer 430*b* may include the light emitting element OLED including a first electrode AE, an emitting layer EML, and a second electrode CE. The emitting layer EML may emit red light R. An emission region EMA of the first sub-pixel SP1' is a region in which red light R is emitted, and may be defined (or partitioned) to correspond to a partial region of the first electrode AE, which is exposed by an opening of a pixel defining layer 435, or the emitting layer EML.

Each transmissive region TA is a region in which the second pixel PXL2 not disposed, and may be a transmissive window (or transparent window). That is, each transmissive region TA may be a region in which a partial component (e.g., the pixel circuit (see PXC shown in FIG. 7) of the pixel circuit layer 430*a* included in the second pixel PXL2 and a partial component (e.g., the light emitting element OLED) of the display element layer 430*b* included in the second pixel PXL2 are removed. When a partial component of each of the pixel circuit layer 430*a* and the display element layer 430*b* is removed, only an insulating layer provided each of between components included in the pixel circuit layer 430*a* and between components included in the display element layer 430*b* may be disposed in each transmissive region TA. In other words, each transmissive region TA may be provided in a manner that components, e.g., the pixel circuit layer 430*a* and the display element layer 430*b*, which are included in the first to fourth sub-pixels SP1' to SP4', are not disposed therein.

As shown in FIG. 10, each transmissive region TA may serve as a transmissive window in which only the buffer layer 431, the gate insulating layer 432, the interlayer insulating layer 433, the passivation layer 434, the pixel defining layer 435, and the thin film encapsulation layer 436, which are sequentially stacked on the substrate 420, are disposed to allow incident light to be transmitted therethrough. In particular, each transmissive region TA may be a region in which the second electrode CE which may have the greatest influence on light transmittance is removed. The second electrode CE is provided in only the second unit pixel regions PXA2, and may not be provided in the transmissive regions TA. In some embodiments, when some of the electrodes included in each of the pixel circuit layer 430*a* and the display element layer 430*b*, which are disposed in each transmissive region TA, are formed with a transparent electrode, and the others are formed with an opaque electrode, the transmissive region TA may be a region in which only the opaque electrode is removed.

In an embodiment of the present disclosure, the second electrode CE2 located in the first display region A1 and the second electrode CE located in the second display region A2 may be electrically and/or physically connected to each other.

In some embodiments, as shown in FIG. 11, each transmissive region TA may include opening OPN for allowing light passing through the transmissive region TA to be transmitted therethrough without any loss. In an embodiment of the present disclosure, the opening OPN may be formed in a manner that a portion of an insulating layer corresponding to each transmissive region TA is removed. For example, the opening OPN may be formed when the interlayer insulating layer 433, the passivation layer 434, and the pixel defining layer 435 are removed in each transmissive region TA. However, the insulating layers removed to form the opening OPN are not limited to the above-described example. For example, it will be apparent that the gate insulating layer 432 or the buffer layer 431 may be removed to form the opening OPN.

When the opening OPN is formed in each of the transmissive regions TA, the thin film encapsulation layer 436 may be provided in a shape fill the opening OPN. The thin film encapsulation layer 436 may be made of a material (or substance) which allows light to be transmitted therethrough so as to minimize loss of light penetrating the opening OPN. In some embodiments, when the opening OPN is formed in each of the transmissive regions TA, an intermediate layer 437 may be provided in a shape filling the opening OPN. In an example, the intermediate layer 437 may be an air layer filling the opening OPN so as to minimize loss of light passing through (or penetrating) the opening OPN. In some embodiments, the intermediate layer 437 may be a transparent adhesive layer (or bonding layer), e.g., an Optically Clear Adhesive (OCA) for reinforcing adhesion between the thin film encapsulation layer 436 and an insulating layer, e.g., the gate insulating layer 432 exposed by the opening OPN while minimizing loss of light passing through the opening OPN. The material of the intermediate layer 437 is not limited to the above-described embodiment, and may be variously selected from materials for minimizing loss of light passing through (or penetrating) the transmissive regions TA.

As described above, the second display region A2 includes the transmissive regions TA in which the second pixels PXL2 are not disposed, to have a relatively high light transmittance per unit area as compared with the first display region A1.

The second display region A2 may overlap with a component 460 which is disposed on the bottom of the substrate 420 and receives light or emits light. When a plurality of transmissive regions TA which allow light to be transmitted therethrough are provided in the second display region A2, an amount (or intensity) of light incident into the component 460 disposed to correspond to the second display region A2 is increased, so that the sensing ability (, sensing accuracy, or recognition rate) of the component 460 can be improved.

The second pixels PXL2 may be disposed at the second density in the second display region A2. The second density may be a ratio of an area except an area in which the second sub-regions SA2 as transmissive regions through which light is transmitted are disposed to a total area of the second display region A2. The second density may be smaller than the first density as a density of the first pixels PXL1 disposed in the first display region A1. The second density may be defined as a total number of the second pixels PXL2 per unit area of the second display region A2 (pixel per inch (PPI)).

When a density of the pixels PXL in the second region A2 is smaller than that of the pixels PXL in the first region A1, an image displayed in the second display region A2 may be viewed relatively darker (i.e., with a lower luminance) than that displayed in the first display region A1. In order to solve this problem, in an embodiment of the present disclosure, an area (or size) of the sub-pixels SP1' to SP4' included in each of the second pixels PXL2 disposed in the second display region A2 may be designed to be greater than that of the sub-pixels SP1 to SP4 included in each of the first pixels PXL1 disposed in the first display region A1. In an example, an area (or size) of the emission region of each of the sub-pixels SP1' to SP4' disposed in the second display region A2 may be designed to be relatively greater than that of the emission region of each of the sub-pixels SP1 to SP4 disposed in the first display region A1.

A sudden change in density and luminance of the pixels PXL between the first display region A1 and the second display region A2 may be viewed as discontinuity of an image by a user. Accordingly, in the present disclosure, the area (or size) of the sub-pixels SP1' to SP4' disposed in the second display region A2 is designed to be greater than that of the sub-pixels SP1 to SP4 disposed in the first display region A1, so that an amount (or intensity) of light emitted from each of the sub-pixels SP1' to SP4' of the second display region A2 can be further secured. Thus, a luminance difference generated in a boundary region between the first and second display regions A1 and A2 can be minimized.

Hereinafter, the above-described technical features of the present disclosure will be described in more detail.

Figure 16:
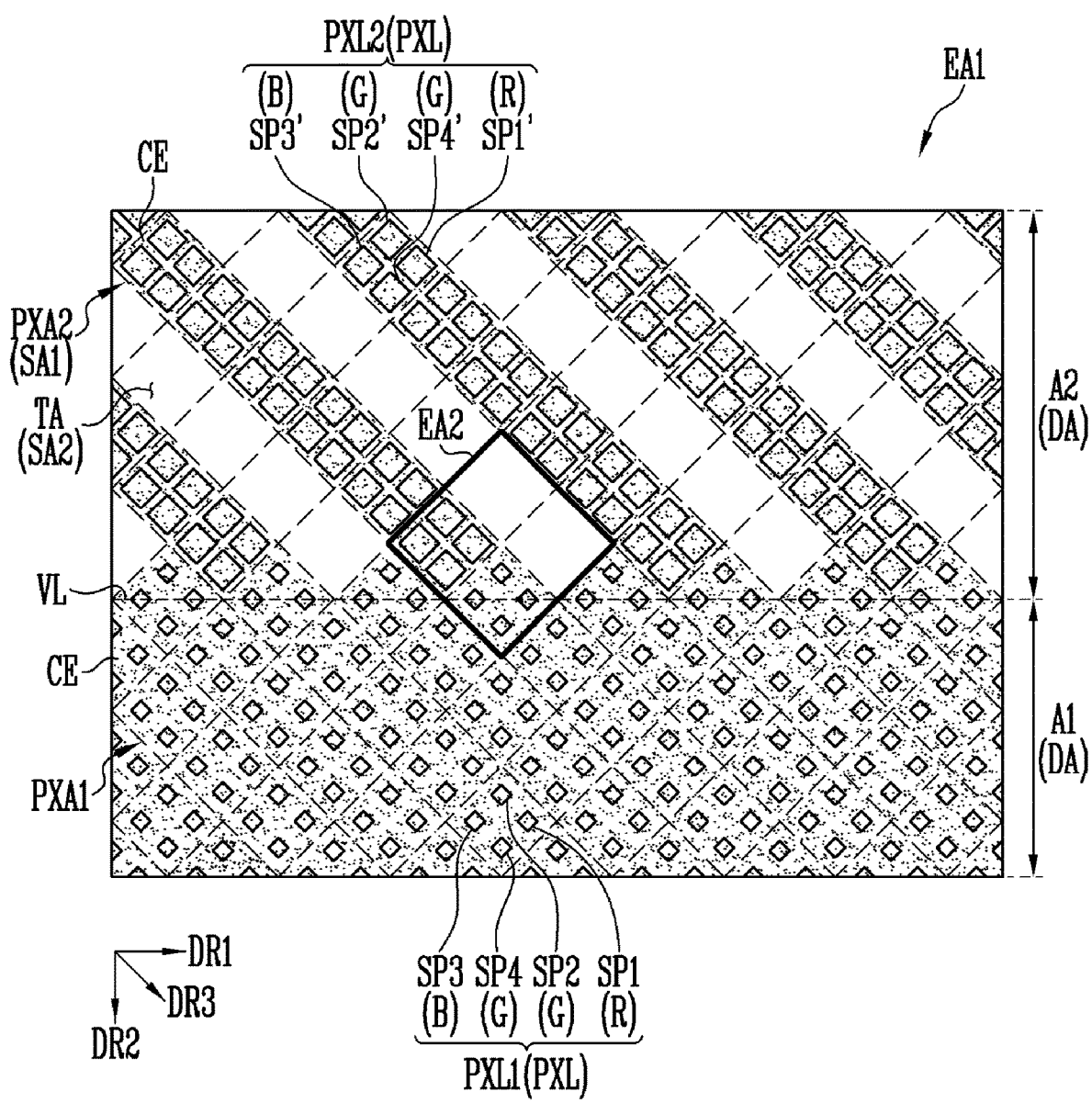
FIG. 16 is a schematic enlarged plan view of portion EA1 shown in FIG. 4A.
Figure 17:
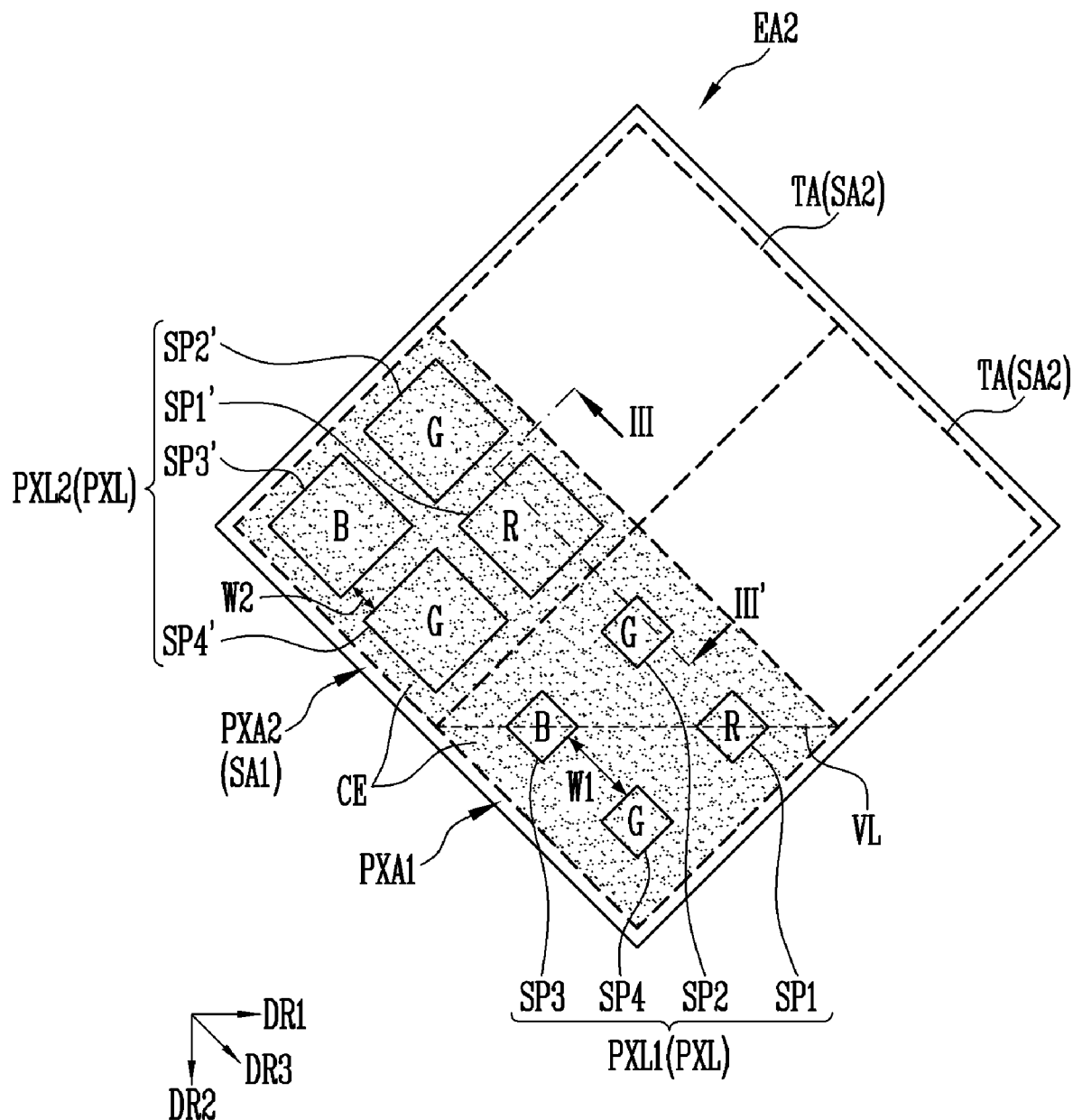
FIG. 17 is a schematic enlarged plan view of portion EA2 shown in FIG. 16.
Figure 18:
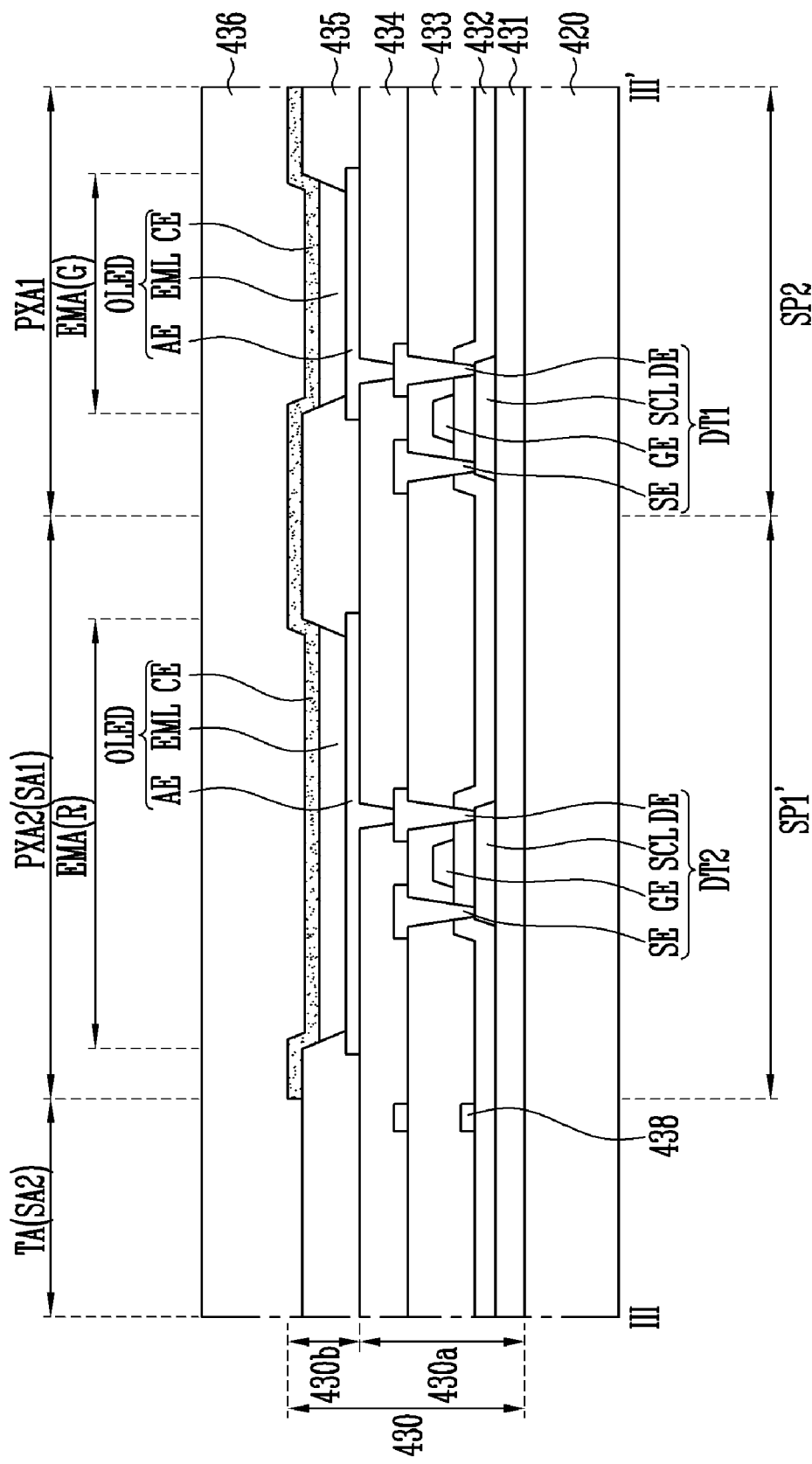
FIG. 18 is a sectional view taken along line shown in FIG. 17.
Figure 19:
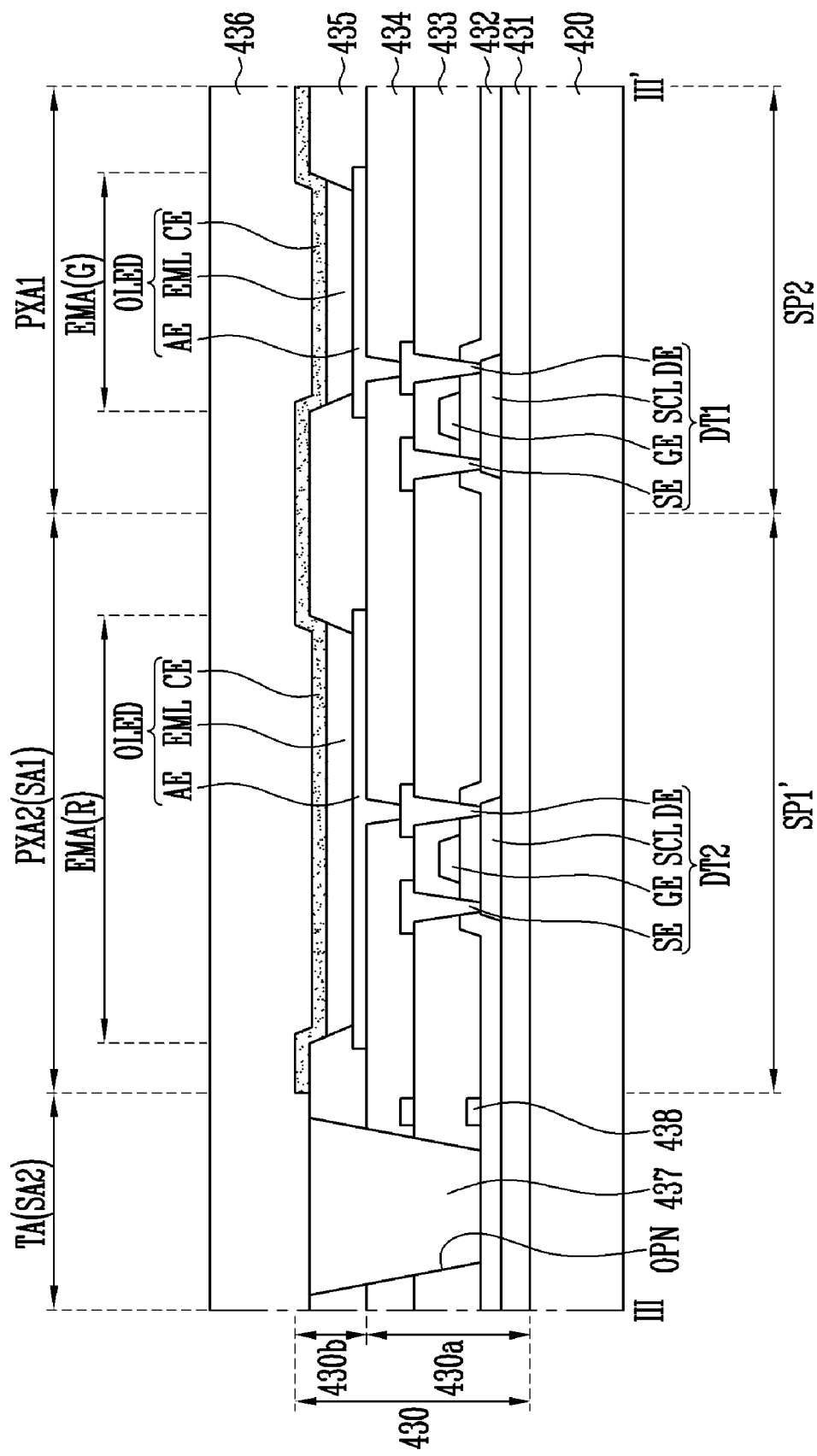
FIG. 19 illustrates another embodiment of a transmissive region shown in FIG. 18, and is a sectional view corresponding to the line shown in FIG. 17.

FIG. 16 is a schematic enlarged plan view of portion EA1 shown in FIG. 4A. FIG. 17 is a schematic enlarged plan view of portion EA2 shown in FIG. 16. FIG. 18 is a sectional view taken along line shown in FIG. 17. FIG. 19 illustrates another embodiment of a transmissive region shown in FIG. 18, and is a sectional view corresponding to the line shown in FIG. 17.

For convenience of description, only a driving transistor DT1 electrically connected to the light emitting element OLED in the pixel circuit layer 430a provided in each first unit pixel region PXA1 and only a driving transistor DT2 electrically connected to the light emitting element OLED in the pixel circuit layer 430a provided in each second unit pixel region PXA2 are illustrated in FIGS. 18 and 19. Each of the driving transistors DT1 and DT2 may have the same configuration as the first transistor T1 described with reference to FIG. 7.

Referring to FIGS. 1 to 19, the display region DA may include a first display region A1 and a second display region A2, which are divided with respect to a virtual line VL extending along the first direction DR1.

The first display region A1 may include a plurality of first unit pixel regions PXA1 in which the respective first pixels PXL1 are disposed. The second display region A2 may include a plurality of second unit pixel regions PXA2 in which the respective second pixels PXL2 are disposed and a plurality of transmissive regions TA in which the second pixels PXL2 are not disposed.

A line unit 438 may be located in each transmissive region TA. The line unit 438 may be a component which electrically and/or physically connects adjacent second unit pixel regions PXA2 with each transmissive region TA interposed therebetween. The line unit 438 may include a plurality of conductive lines located in different layers in the pixel circuit layer 430a. The line unit 438 may be disposed while detouring adjacent to each of the adjacent second unit pixel regions PXA2 so as to minimize loss of light penetrating (or passing through) each transmissive region TA.

As shown in FIG. 19, each transmissive region TA may include an opening OPN for further securing an amount of light incident into the component 460. The opening OPN may be the same as the opening OPN described with reference to FIG. 11. The opening OPN may be filled with an intermediate layer 437.

Some of the first unit pixel regions PXA1 may be provided throughout the first display region A1 and the second display region A2 between the first display region A1 and the second display region A2, but the present disclosure is not limited thereto. In some embodiments, the first unit pixel regions PXA1 are provided in only the first display region A1, and may not be provided in the second display region A2.

One first pixel PXL1 may include first to fourth sub-pixels SP1, SP2, SP3, and SP4, and one second pixel PXL2 may include first to fourth sub-pixels SP1', SP2', SP3', and SP4'. The first to fourth sub-pixels SP1 to SP4 of the one first pixel PXL1 and the first to fourth sub-pixels SP1' to SP4' of the one second pixel PXL2 may include a substrate 420, a pixel circuit layer 430a including a pixel circuit (see PXC shown in FIG. 7), and a display element layer 430b including a light emitting element OLED.

In an embodiment of the present disclosure, the first to fourth sub-pixels SP1 to SP4 included in the one first pixel PXL1 may be disposed to be spaced apart from each other in a first unit pixel region PXA1. Each of the first to fourth sub-pixels SP1 to SP4 may be spaced apart from adjacent sub-pixels. In an example, adjacent sub-pixels in the first unit pixel region PXA1 may be spaced apart from each other at a first width W1. The distance between adjacent sub-pixels in one first unit pixel region PXA1 may correspond to the region in which light is not emitted, i.e., the non-emission region NEMA described with reference to FIG. 8.

The first to fourth sub-pixels SP1' to SP4' included in the one second pixel PXL2 may be disposed to be spaced apart from each other in a second unit pixel region PXA2. Each of the first to fourth sub-pixels SP1' to SP4' may be spaced apart from adjacent sub-pixels. In an example, adjacent sub-pixels in the second unit pixel region PXA2 may be spaced apart from each other at a second width W2 narrower than the first width W1. The distance between adjacent sub-pixels in one second unit pixel region PXA2 may correspond to the non-emission region NEMA in which light is not emitted.

In an embodiment of the present disclosure, an area (or size) of the non-emission region NEMA of each of the second unit pixel regions PXA2 may be smaller than that of the non-emission region NEMA of each of the first unit pixel regions PXA1. That is, an area (or size) of the emission region EMA of one second unit pixel region PXA2 may be greater than that of the emission region EMA of one first unit pixel region PXA1.

In the following embodiment, for convenience of description, the first sub-pixel SP1' provided in each second unit pixel region PXA2 is referred to as a (2-1)th sub-pixel SP1', the second sub-pixel SP2' provided in the second unit pixel region PXA2 is referred to as a (2-2)th sub-pixel SP2', the third sub-pixel SP3' provided in the second unit pixel region PXA2 is referred to as a (2-3)th sub-pixel SP3', and the fourth sub-pixel SP4' provided in the second unit pixel region PXA2 is referred to as a (2-4)th sub-pixel SP4'.

The (2-1)th to (2-4)th sub-pixels SP1' to SP4' in each second unit pixel region PXA2 may have the same area (or size). In addition, the first to fourth sub-pixels SP1 to SP4 in one first unit pixel region PXA1 may have the same area (or size).

In an embodiment of the present disclosure, each of the (2-1)th to (2-4)th sub-pixels SP1' to SP4' may be designed to have an area (or size) greater than that of each of the first to fourth sub-pixels SP1 to SP4. That is, the emission region of each of the (2-1)th to (2-4)th sub-pixels SP1' to SP4' may be designed to have an area (or size) greater than that of the emission region of each of the first to fourth sub-pixels SP1 to SP4.

As shown in FIG. 18, the emission region EMA of the (2-1)th sub-pixel SP1' which emits red light R in one second unit pixel region PXA2 may be designed to have an area (or size) greater than that of the emission region EMA of the second sub-pixel which emits green light G in one first unit pixel region PXA1.

When the first electrode AE (anode electrode) exposed by the opening of the pixel defining layer 435 in the (2-1)th sub-pixel SP1' is designed to have an area (or size) greater than that of the first electrode AE (anode electrode) exposed by the opening of the pixel defining layer 435 in the second sub-pixel SP2, the area (or size) of the emission region EMA of the (2-1)th sub-pixel SP1' may be greater than that of the emission region EMA of the second sub-pixel SP2. When the (2-1)th sub-pixel SP1' is controlled to emit light with a luminance relatively higher than that of the second sub-pixel SP2 with respect to the same image data when the area (or size) of the emission region EMA of the (2-1)th sub-pixel SP1' is greater than that of the emission region EMA of the second sub-pixel SP2, an amount (or intensity) of light emitted in the emission region EMA of the (2-1)th sub-pixel SP1' may be greater than that of light emitted in the emission region EMA of the second sub-pixel SP2.

Although the second display region A2 includes a plurality of transmissive regions TA which allow light emitted from the second pixels PXL2 to be transmitted through the component 460 disposed on the bottom thereof without emitting light, amounts of lights emitted per the same area (, unit area or predetermined area) respectively from the first display region A1 and the second display region A2 may be substantially similar or equal to each other. Accordingly, a difference in luminance between the first and second display regions A1 and A2, which caused due to a difference in density of pixels PXL between the first display region A1 and the second display region A2, can be reduced. Consequently, the image quality of the display panel 410 can be improved.

Meanwhile, the first to fourth sub-pixels SP1' to SP4' included in each second pixel PXL2 may be designed to have an area (or size) equal to that of the first to fourth sub-pixels SP1 to SP4 included in each first pixel PXL1. In order to compensate for a difference in luminance between the first display region A1 and the second display region A2, the second pixels PXL2 may be controlled to emit light with a luminance very higher than that of the first pixels PXL1 by supplying an excessive current to the second pixels PXL2. When the excessive current is continuously supplied to the second pixels PXL2, an emitting layer EML included in each of the second pixels PXL2 is rapidly degraded, and therefore, the lifetime of the light emitting element OLED including the emitting layer EML may be shortened. Accordingly, in the present disclosure, the first to fourth sub-pixels SP1' to SP4' included in each second pixel PXL2 is designed to have an area (or size) greater than that of the first to fourth sub-pixels SP1 to SP4 included in each first pixel PXL1, so that light emitted from the second pixels PXL2 is further secured than the first pixels PXL1 with respect to the same image data. Thus, degradation of the emitting layer EML included in the second pixels PXL2 can be minimized.

The lifetime of the light emitting element OLED included in each of the first and second pixels PXL1 and PXL2 may be predicted through the following equation.

$$\tau_1 = \tau_0 \left(\frac{L_0}{L_1}\right)^{acc}$$

$\tau_0$ May denote a reference lifetime, $L_0$ may denote a reference initial luminance, $\tau_1$ may denote a lifetime, $L_1$ may denote an initial luminance, and acc may denote an acceleration factor. The acceleration factor may represent other conditions (e.g., a temperature, a device characteristic, and a material characteristic). The reference lifetime may be, for example, a lifetime of a pixel PXL having an aperture ratio of 100%, and a case where the reference lifetime is 1000 is assumed for convenience of description. That is, the lifetime $\tau$ of the pixel PXL having the aperture ratio of 100% may be 1000.

For example, when the area (or size) of the first to fourth sub-pixels SP1' to SP4' included in each second pixel PXL2 is equal to that of the first to fourth sub-pixels SP1 to SP4 included in each first pixel PXL1, an aperture ratio of a second unit pixel region PXA2 in which one second pixel PXL2 is disposed and a transmissive region TA adjacent thereto may be about a half of that of a first unit pixel region PXA1 in which one first pixel PXL1 is disposed. In an example, when the aperture ratio of the first unit pixel region PXA1 is 20%, the aperture ratio of the second unit pixel PXA2 and the transmissive region TA adjacent thereto may be 10%.

When the luminance required in each of the first pixel PXL1 and the second pixel PXL2 is 100 cd/m$^2$, an actual luminance of the first pixel PXL1 may become 500 cd/m$^2$, and an actual luminance of the second pixel PXL2 may become 1000 cd/m$^2$. When a lifetime of the first pixel PXL1 is calculated according to the above-described equation, the lifetime of the first pixel PXL1 may be 1000*(0.2)$^{1.8}$. In addition, when a lifetime of the second pixel PXL2 is calculated according to the above-described equation, the lifetime of the second pixel PXL2 may be 1000*(0.1)$^{1.8}$. When assuming that the lifetime of the first pixel PXL1 is 100%, the lifetime of the second pixel PXL2 may be 28.70%. As described above, when the area (or size) of the first to fourth sub-pixels SP1 to SP4 included in the first pixels PXL1 and the area (or size) of the first to fourth sub-pixels SP1' to SP4' included in the second pixel PXL2 are the same, the lifetime of the second pixel PXL2 may be relatively shorter than that of the first pixel PXL1.

When the area (or size) of the first to fourth sub-pixels SP1' to SP4' included in the second pixel PXL2 is twice of that of the first to fourth sub-pixels SP1 to SP4 included in the first pixels PXL1, the aperture ratio of the second unit pixel region PXA2 in which the second pixel PXL2 is disposed and the transmissive region TA adjacent thereto may be equal to that of the first unit pixel region PXA1 in which the first pixel PXL1 is disposed. The lifetime of the second pixel PXL2 may be equal to that of the first pixel PXL1.

Several factors may complexly act on the lifetime of each of the first and second pixels PXL1 and PXL2. However, when the aperture ratio as a main factor is increased, a current density applied to the emitting layer EML of the light emitting element OLED included in each pixel PXL can be decreased. In particular, when the aperture ratio of a second pixel PXL2 located in the second display region A2 is increased, a current density applied to the emitting layer EML of the light emitting element OLED included in the second pixel PXL2 is decreased. Thus, an initial luminance can be lowered, and degradation of the emitting layer EML can be reduced. Accordingly, the lifetime of the second pixel PXL2 can be improved.

FIGS. 20, 21, 22, and 23 illustrate another embodiment of the first and second display regions and first and second pixels, which are shown in FIG. 4A, and is an enlarged plan view corresponding to the portion EA1 shown in FIG. 4A.

In relation to first and second display regions shown in FIGS. 20, 21, 22, and 23, portions different from those of the above-described embodiment will be mainly described to avoid redundancy. Portions not particularly described in this embodiment follow those of the above-described embodiment. In addition, identical reference numerals refer to identical components, and similar reference numerals refer to similar components.

Referring to FIGS. 1 to 15 and 20 to 23, the display region DA may include a first display region A1 and a second display region A2, which are divided with respect to a virtual line VL extending along the first direction DR1. First pixels PXL1 may be provided in the first display region A1.

The second region A2 may include a plurality of second unit pixel regions PXA2 in which respective second pixels PXL2 are arranged (or provided) and a plurality of transmissive regions TA in which the second pixel PXL2 is not arranged. Each second pixel PXL2 may include one or more sub-pixels SP1' to SP4', and each first pixel PXL1 may include one or more sub-pixels SP1 to SP4.

In an embodiment of the present disclosure, the sub-pixels SP1' to SP4' included in each second pixel PXL2 may be designed to have an area (or size) relatively greater than that of the sub-pixels SP1 to SP4 included in each first pixel PXL1. In an example, the sub-pixels SP1' to SP4' included in each second pixel PXL2 may be designed to have an area (or size) which is twice or more of that of the sub-pixels SP1 to SP4 included in each first pixel PXL1. However, the present disclosure is not limited thereto. In some embodiments, the sub-pixels SP1' to SP4' included in each second pixel PXL2 may be designed to have an area (or size) relatively greater than that of the sub-pixels SP1 to SP4 included in each first pixel PXL1 and to have various sizes within a range in which the sub-pixels SP1' to SP4' can be disposed to be spaced apart from adjacent sub-pixels at a certain distance in the second display region A2.

Figure 22:
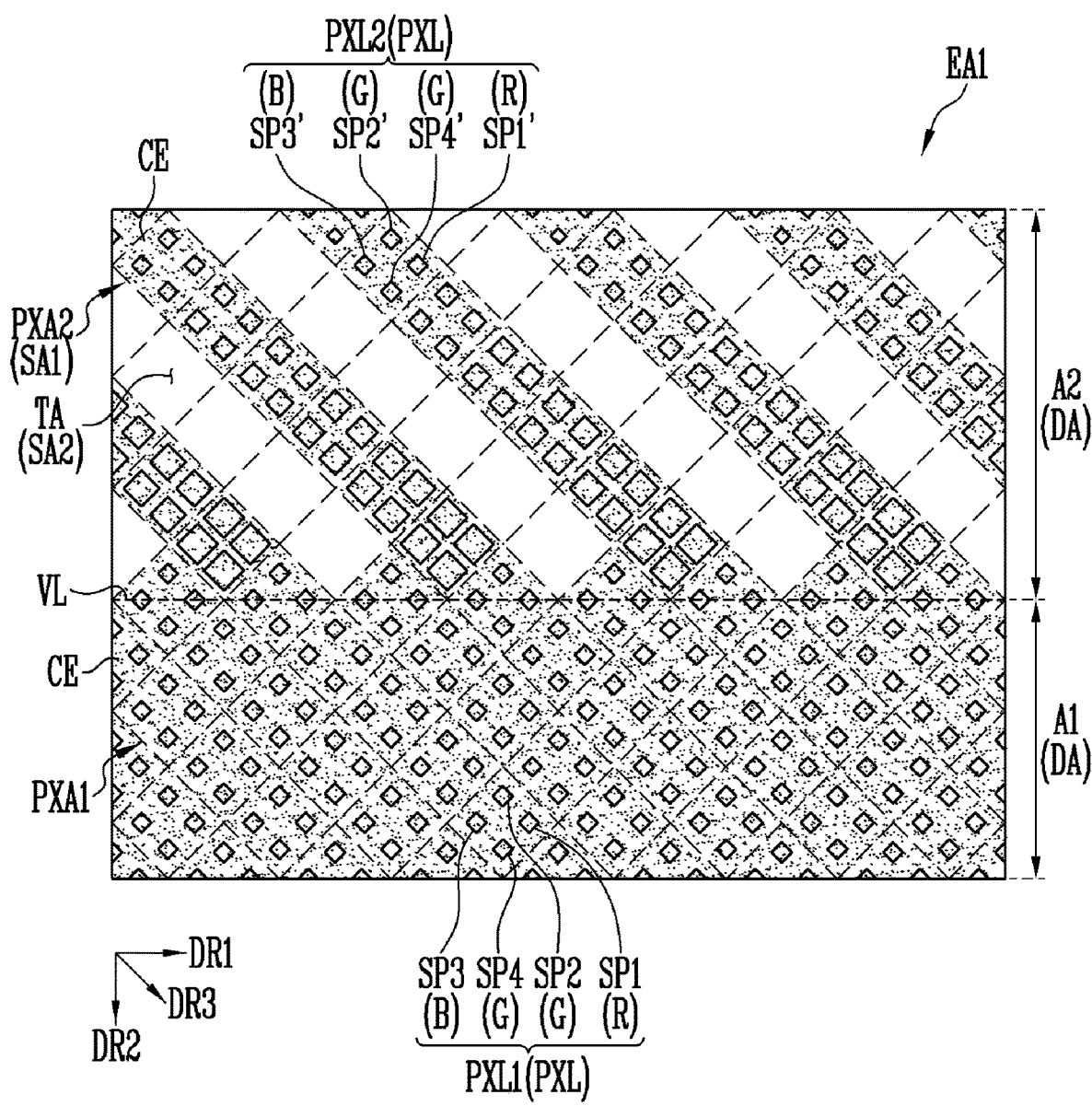
Figure 23:
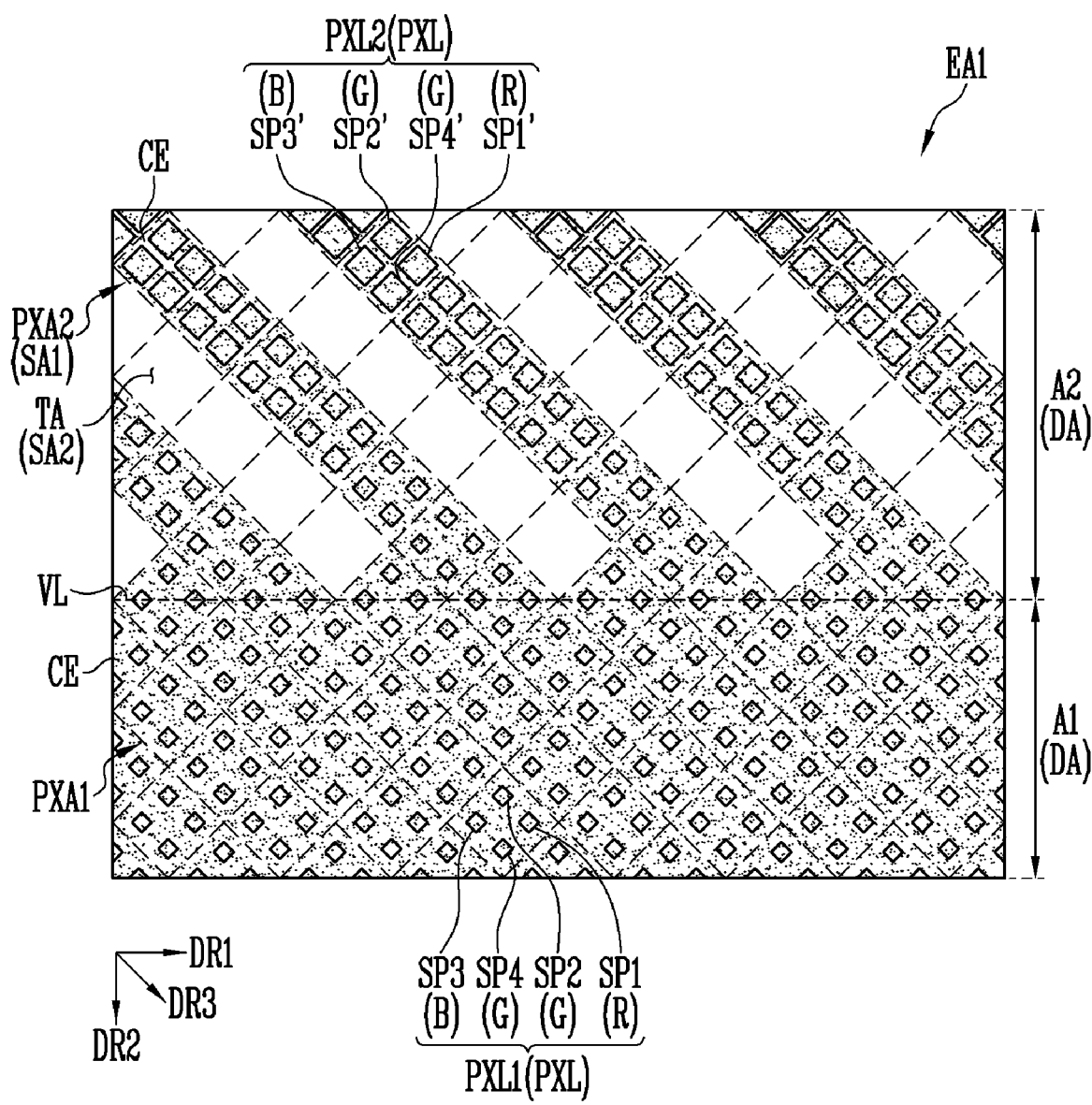

In some embodiments, as shown in FIG. 22, the sub-pixels SP1' to SP4' included in each second pixel PXL2 may be designed to have an area (or size) gradually increased as approaching a virtual line VL located at a boundary between the first display region A1 and the second display region A2. In some embodiments, as shown in FIG. 23, the sub-pixels SP1' to SP4' included in one second pixel PXL2 may be designed to have an area (or size) gradually decreased as approaching the virtual line VL. In another embodiment, the sub-pixels SP1' to SP4' included in each second pixel PXL2 may be designed to have an area (or size) gradually increased or decreased along a specific direction, e.g., any one direction among the first to third directions DR1 to DR3.

Figure 20:
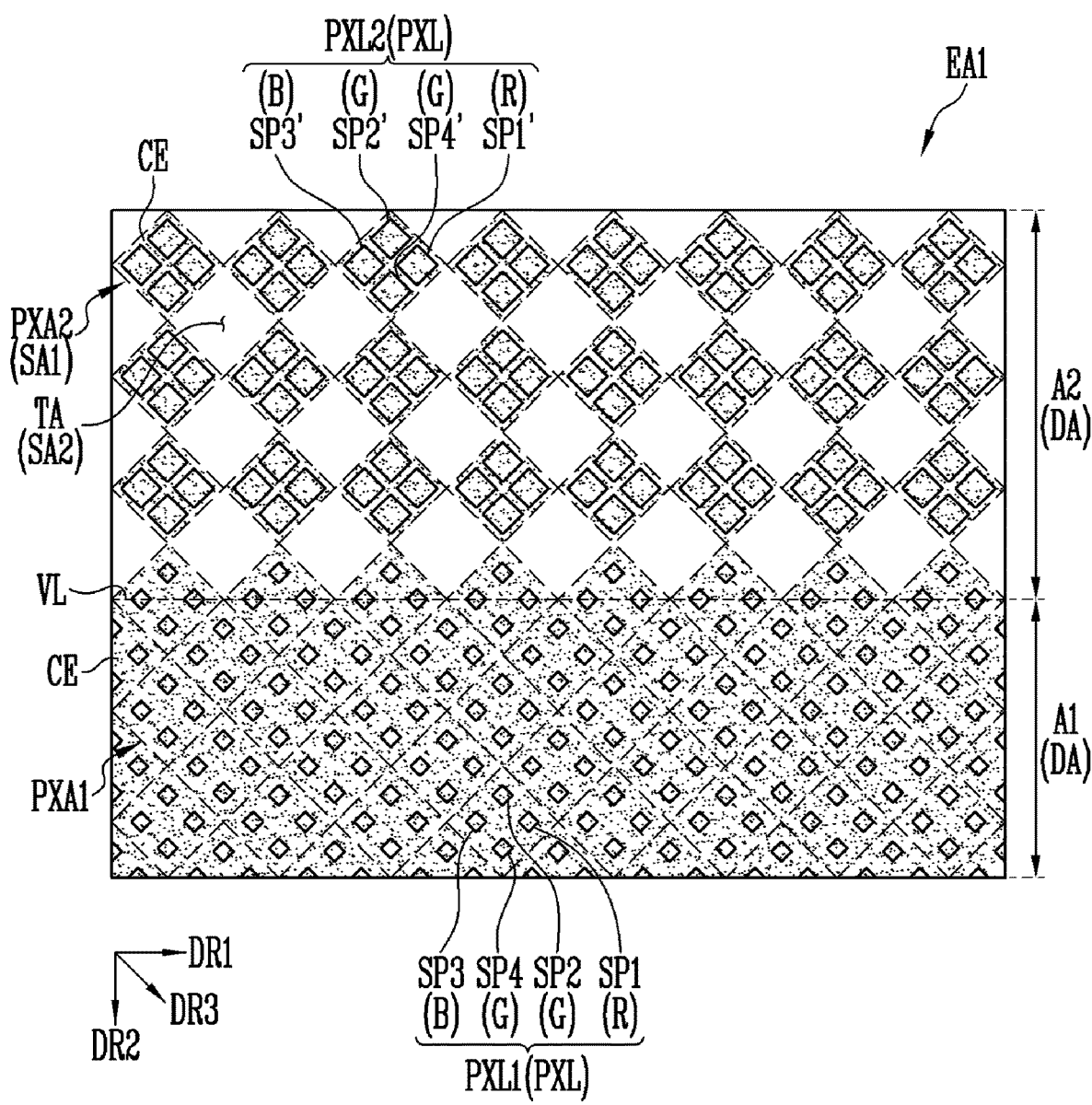
FIGS. 20, 21, 22, and 23 illustrate another embodiment of the first and second display regions and first and second pixels, which are shown in FIG. 4A, and is an enlarged plan view corresponding to the portion EA1 shown in FIG. 4A.

As shown in FIG. 20, the second unit pixel regions PXA2 may constitute at least one column repeatedly arranged along the second direction DR2 in the second display region A2, and the transmissive regions TA may constitute at least one row repeatedly arranged along the first direction DR1 orthogonal to the second direction DR2 in the second display region A2. Also, the second unit pixel regions PXA2 may constitute at least another row repeatedly arranged along the first direction DR1 in the second display region A2, and the transmissive regions TA may constitute at least another column repeatedly arranged along the second direction DR2 orthogonal to the first direction DR1 in the second display region A2. The one column and the another column may be alternately disposed. In an example, one second unit pixel region PXA2 and one transmissive region TA may be alternately disposed in the second display region A2.

Figure 21:
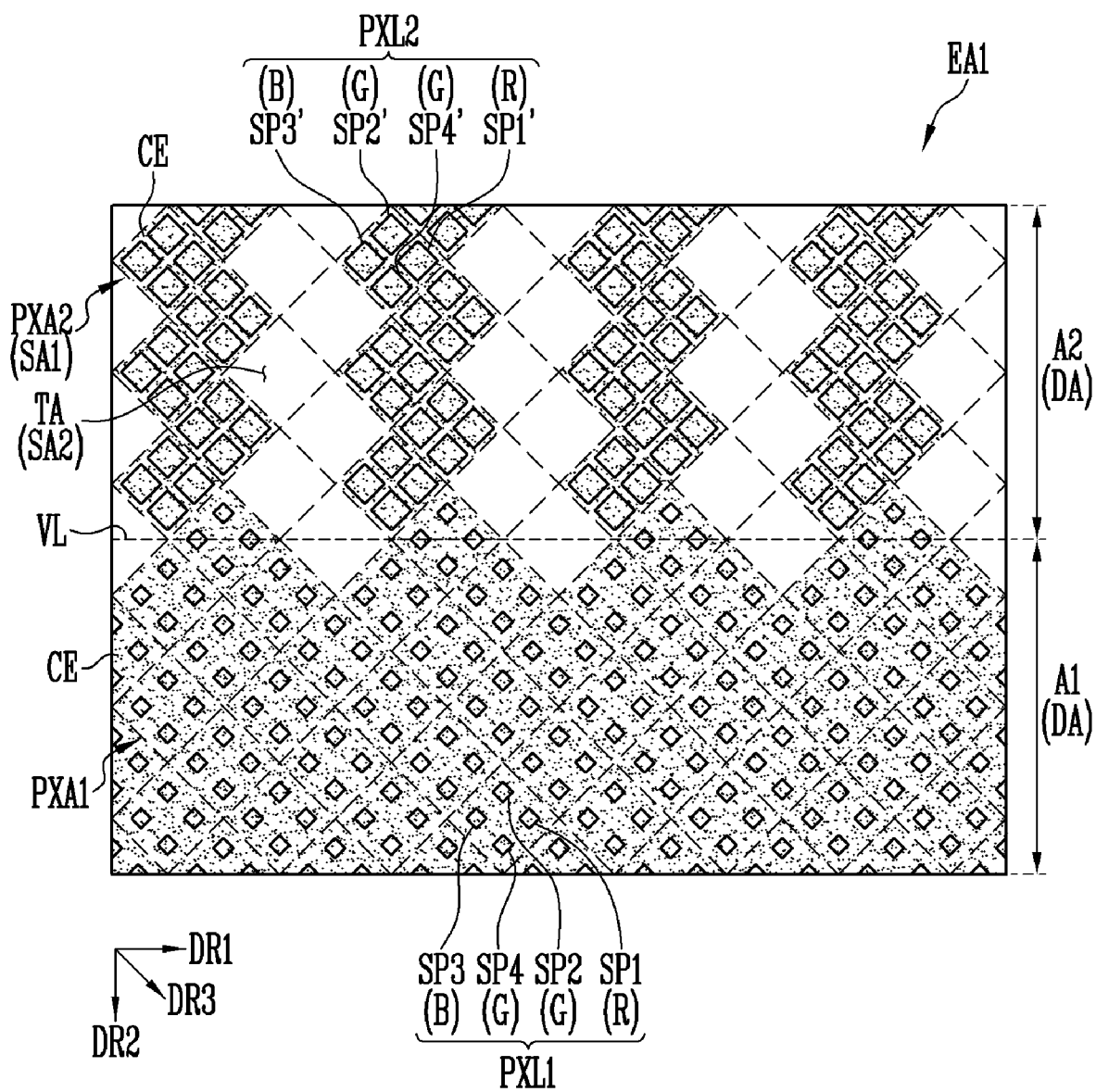

In some embodiments, as shown in FIG. 21, the second unit pixel regions PXA2 may be repeatedly arranged along the second direction DR2 in the second display region A2 to constitute a first column, and the transmissive regions TA may be repeatedly arranged along the second direction DR2 to constitute a second column. The first column and the second column may be alternately disposed along the first direction DR1 in the second display region A2. When viewed on a plane, the second unit pixel regions PXA2 and the transmissive regions TA may have continuity in a vertical direction (e.g., the second direction DR2).

In another embodiment, the second unit pixel regions PXA2 may be repeatedly arranged along the first direction DR1 in the second display region A2 to constitute a first row, and the transmissive regions TA may be repeatedly arranged along the first direction DR1 to constitute a second row. The first row and the second row may be alternately disposed along the second direction DR2 in the second display region A2. When viewed on a plane, the second unit pixel regions PXA2 and the transmissive regions TA may have continuity in a horizontal direction (e.g., the first direction DR1).

In accordance with the present disclosure, there can be provided an electronic device with a display portion, which can minimize image discontinuity at a boundary between a first display region and a second display region, and improve visibility of an image with respect to a user.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic device defining a first direction, a second direction perpendicular to the first direction, and a third direction between the first direction and the second direction, the electronic device comprising:
   a display panel configured for displaying an image, wherein the display panel includes:
      a substrate including a first display region and a second display region, which are adjacent to each other, and a non-display region surrounding at least one side of each of the first and second display regions;
      a plurality of first pixels disposed in the first display region; and
      a plurality of second pixels disposed in the second display region,
   wherein the second display region includes a first sub-region in which each of the second pixels is disposed and a second sub-region in which the second pixel is not disposed,
   wherein the second display region has a light transmittance higher than that of the first display region, wherein each of the first pixels has a size different from that of each of the second pixels,
wherein the first display region includes a plurality of first unit pixel regions, each first unit pixel region including one of the first pixels, and the second display region includes a plurality of second unit pixel regions, each second unit pixel region including one of the second pixels,
wherein each of the first pixels comprises four first sub-pixels, two of the first sub-pixels being arranged in a first column in the first unit pixel region along the second direction, and the remaining first sub-pixels being arranged in columns different from the first column in the first unit pixel region,
wherein each of the first sub-pixels includes:
   a first electrode disposed on the substrate;
   a first emitting layer disposed on the first electrode; and
   a second electrode disposed on the first emitting layer,
wherein each of the second pixels comprises four second sub-pixels, two of the second sub-pixels being arranged in a second column in the second unit pixel region along the second direction, and the remaining second sub-pixels being arranged in columns different from the second column in the second unit pixel region,
wherein each of the second unit pixel regions has a rhombus shape, in which each side thereof is parallel to a side of one of the second sub-pixels included therein,
wherein the second unit pixel regions are arranged along the third direction,
wherein the second sub-region extends along the third direction such that a longest dimension thereof is along the third direction,
wherein all of the first sub-pixels have a same size,
wherein all of the second sub-pixels have a same size that is larger than the first sub-pixels,
wherein the second sub-pixel includes:
   a third electrode disposed on the substrate, the third electrode being provided in the same layer as the first electrode;
   a second emitting layer disposed on the third electrode; and
   a fourth electrode disposed on the second emitting layer, and
wherein the second sub-region and the fourth electrode do not overlap.

2. The electronic device of claim 1, wherein the first pixels in the first display region have a density higher than that of the second pixels in the second display region, and
wherein the second display region has a size smaller than that of the first display region, and is connected to the first display region.

3. The electronic device of claim 2, wherein the second pixels are arranged in an oblique direction on a plane.

4. The electronic device of claim 2, comprising at least one sensor disposed on a rear surface of the display panel.

5. The electronic device of claim 4, wherein the at least one sensor includes at least one of a camera, a proximity sensor, an illuminance sensor, a gesture sensor, a motion sensor, a fingerprint recognition sensor, and a biometric sensor, or combinations thereof.

6. The electronic device of claim 4, wherein the second sub-region includes a transmissive region through which light is transmitted.

7. The electronic device of claim 6, wherein the first sub-region and the second sub-region are alternately disposed.

8. The electronic device of claim 7, wherein the second display region comprises a plurality of the first sub-regions and a plurality of the second sub-regions.

9. The electronic device of claim 8, wherein the plurality of first sub-regions are repeatedly arranged along one direction in the second display region to constitute at least one first column, and
the plurality of second sub-regions are repeatedly arranged along the one direction in the second display region to constitute at least one second column,
wherein the first column and the second column are alternately disposed.

10. The electronic device of claim 8, wherein the plurality of first sub-regions are repeatedly arranged along one direction in the second display region to constitute at least one column, and
the plurality of second sub-regions are repeatedly arranged along a direction orthogonal to the one direction to constitute at least one row.

11. The electronic device of claim 6, wherein the second sub-region includes at least one insulating layer which is disposed on the substrate and includes an opening.

12. The electronic device of claim 11, wherein the second sub-region includes a filling material filling the opening.

13. The electronic device of claim 1, wherein the first sub-pixel and the second sub-pixel have different sizes.

14. The electronic device of claim 13, wherein the second sub-pixel has a size greater than that of the first sub-pixel.

15. The electronic device of claim 14, wherein the first sub-pixel includes a first emission region in which the first electrode, the first emitting layer, and the second electrode overlap with each other, and
the second sub-pixel includes a second emission region in which the third electrode, the second emitting layer, and the fourth electrode overlap with each other,
wherein the second emission region has a size greater than that of the first emission region.

16. The electronic device of claim 13, wherein a size of the second sub-pixel gradually changes approaching a boundary portion between the first display region and the second display region.

17. The electronic device of claim 16, wherein the second sub-pixel has a size gradually decreased as approaching the boundary portion between the boundary portion and the second display region.

18. The electronic device of claim 16, wherein the second sub-pixel has a size gradually increased as approaching the boundary portion between the boundary portion and the second display region.

19. The electronic device of claim 1, further comprising an insulating layer disposed between the substrate and the third electrode, wherein the insulating layer extends to the second sub-region, and
wherein the fourth electrode does not extend to the second sub-region.

20. The electronic device of claim 19, wherein each of the first and second sub-pixels emits any one of red light, green light, blue light, and white light.

21. The electronic device of claim 1, wherein each of the first and second pixels includes a pixel circuit layer which is disposed on the substrate and includes at least one transistor.

22. The electronic device of claim 1, wherein the first unit pixel region and the second unit pixel region have the same size.

23. An electronic device defining a first direction, a second direction perpendicular to the first direction, and a third direction between the first direction and the second direction, the electronic device comprising:
a sensor configured for sensing incident light;
a display portion overlapping with the sensor, the display portion configured for displaying an image;
a window provided on the display portion to cover the display portion; and
a touch sensor provided between the display portion and the window, the touch sensor configured for sensing a touch of a user,
wherein the display portion includes:
a substrate including a first display region, a second display region which has an area smaller than that of the first display region, is connected to the first display region, and has a light transmittance higher than that of the first display region, and a non-display region surrounding the periphery of each of the first and second display regions;
a plurality of first pixels provided in the first display region; and
a plurality of second pixels provided in the second display region, the plurality of second pixels being different from the first pixels, the plurality of second pixels each having a size greater than that of each of the first pixels,
wherein the second display region includes a first sub-region in which each of the second pixels is disposed and a transmissive region in which the second pixel is not disposed, the transmissive region having light transmitted therethrough,
wherein the first sub-region and the transmissive region are alternately disposed when viewed on a plane,
wherein the first display region includes a plurality of first unit pixel regions, each first unit pixel region including one of the first pixels and the second display region includes a plurality of second unit pixel regions, each second unit pixel region including one of the second pixels,
wherein each of the first pixels comprises four first sub-pixels, two of the first sub-pixels being arranged in a first column in the first unit pixel region, and the remaining first sub-pixels being arranged in columns different from the first column in the first unit pixel region,
wherein each of the first sub-pixels includes:
a first electrode disposed on the substrate;
a first emitting layer disposed on the first electrode; and
a second electrode disposed on the first emitting layer,
wherein each of the second pixels comprises four second sub-pixels, two of the second sub-pixels being arranged in a second column in the second unit pixel region along the second direction, and the remaining second sub-pixels being arranged in columns different from the second column in the second unit pixel region,
wherein each of the second unit pixel regions has a rhombus shape, in which each side thereof is parallel to a side of one of the second sub-pixels included therein,
wherein the second unit pixel regions are arranged along the third direction,
wherein the second sub-region extends along the third direction such that a longest dimension thereof is along the third direction,
wherein all of the first sub-pixels have a same size,
wherein all of the second sub-pixels have a same size that is larger than the first sub-pixels,
wherein each of the second pixels includes a second sub-pixel provided in the first sub-region,
wherein the second sub-pixel includes:
a third electrode disposed on the substrate, the third electrode being provided in the same layer as the first electrode;
a second emitting layer disposed on the third electrode; and
a fourth electrode disposed on the second emitting layer, and
wherein the second sub-region and the fourth electrode do not overlap.

* * * * *